United States Patent
Kim et al.

(10) Patent No.: US 12,346,022 B2
(45) Date of Patent: Jul. 1, 2025

(54) METHOD OF FABRICATING PELLICLE STRUCTURE

(71) Applicant: SAMSUNG ELECTRONICS CO., LTD., Suwon-si (KR)

(72) Inventors: Mun Ja Kim, Hwaseong-si (KR); Ji Beom Yoo, Seoul (KR); Ki Bong Nam, Suwon-si (KR); Jin Ho Yeo, Suwon-si (KR); Changyoung Jeong, Yongin-si (KR); Qicheng Hu, Suwon-si (KR)

(73) Assignees: SAMSUNG ELECTRONICS CO., LTD. (KR); Research & Business Foundation SUNGKYUNKWAN UNIVERSITY (KR)

( * ) Notice: Subject to any disclaimer, the term of this patent is extended or adjusted under 35 U.S.C. 154(b) by 381 days.

(21) Appl. No.: 17/933,769

(22) Filed: Sep. 20, 2022

(65) Prior Publication Data

US 2023/0273515 A1    Aug. 31, 2023

(30) Foreign Application Priority Data

Feb. 28, 2022    (KR) .................. 10-2022-0026288

(51) Int. Cl.
   *G03F 1/62* (2012.01)
   *G03F 7/00* (2006.01)

(52) U.S. Cl.
   CPC ............ *G03F 1/62* (2013.01); *G03F 7/70983* (2013.01)

(58) Field of Classification Search
   CPC .......... G03F 1/62; G03F 7/70983; G03F 1/72; G03F 1/64; G03F 1/68
   USPC ............................................. 216/37
   See application file for complete search history.

(56) References Cited

U.S. PATENT DOCUMENTS

| | | | |
|---|---|---|---|
| 8,753,468 B2 | 6/2014 | Caldwell et al. | |
| 9,196,478 B2 | 11/2015 | Lee et al. | |
| 9,360,749 B2* | 6/2016 | Lin | G03F 1/64 |
| 9,612,528 B2 | 4/2017 | Kim et al. | |
| 10,053,367 B2 | 8/2018 | Yanase | |
| 2014/0335681 A1* | 11/2014 | Lee | H01L 21/2007 438/478 |
| 2015/0371848 A1 | 12/2015 | Zaretski et al. | |
| 2020/0192216 A1 | 6/2020 | Yanase | |
| 2020/0341364 A1* | 10/2020 | Kim | G03F 1/62 |

FOREIGN PATENT DOCUMENTS

| | | |
|---|---|---|
| JP | 5876927 B2 | 1/2016 |
| JP | 2020160345 A | 10/2020 |
| JP | 2021001112 A | 1/2021 |
| KR | 20200124556 A | 11/2020 |

* cited by examiner

*Primary Examiner* — Duy Vu N Deo
(74) *Attorney, Agent, or Firm* — Myers Bigel, P.A.

(57) ABSTRACT

A method of fabricating a pellicle structure includes forming a metal layer on a temporary substrate, forming a membrane on the metal layer, exposing a bottom surface of the metal layer by separating the temporary substrate from the metal layer, and exposing a bottom surface of the membrane by etching the exposed bottom surface of the metal layer.

20 Claims, 24 Drawing Sheets

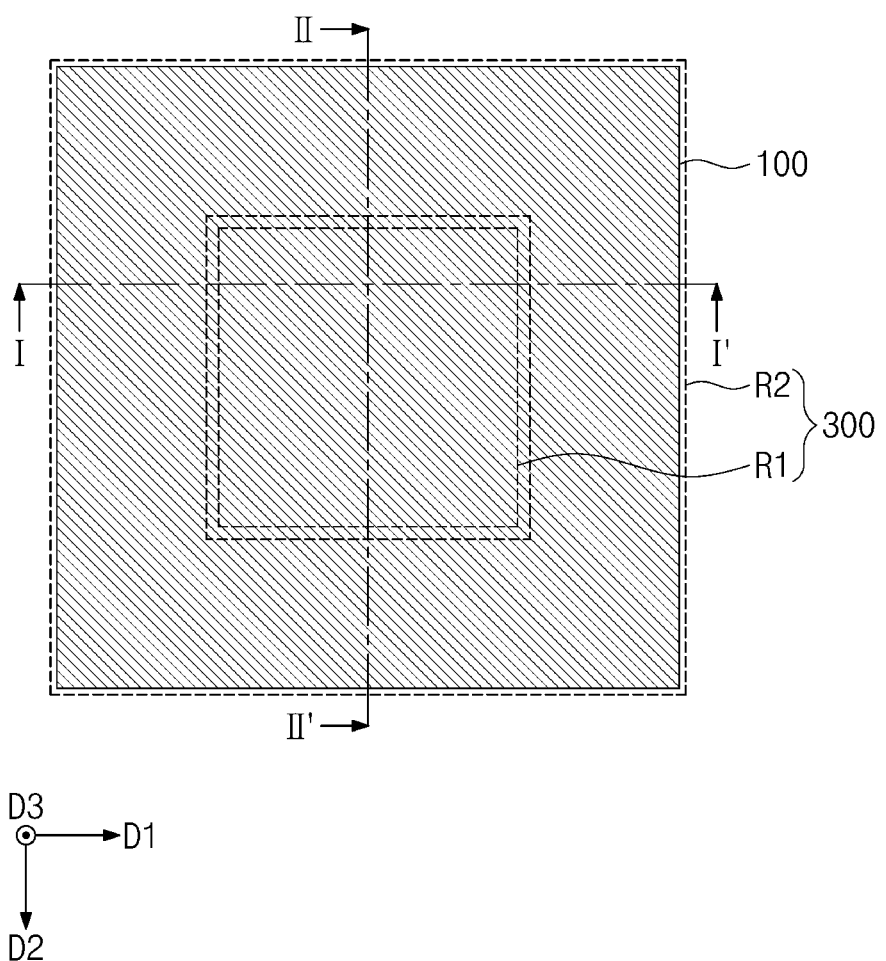

METHOD OF FABRICATING PELLICLE STRUCTURE

CROSS-REFERENCE TO RELATED APPLICATION

This U.S. nonprovisional application claims priority under 35 U.S.C. § 119 to Korean Patent Application No. 10-2022-0026288 filed on Feb. 28, 2022 in the Korean Intellectual Property Office, the disclosure of which is hereby incorporated by reference in its entirety.

BACKGROUND

The present inventive concepts relate to pellicle structures, and more particularly, to methods of fabricating pellicle structures.

Semiconductor device fabrication may utilize a lithography process to form circuit patterns on a wafer. The lithography process may use a photomask to transfer desired patterns onto a substrate. When the photomask is contaminated with a foreign substance such as particles from an external environment, or is deformed by the external environment, defects may occur on the wafer to which a pattern of the photomask is transferred. Accordingly, it is desirable to protect photomasks from foreign substances and from deformation.

SUMMARY

Some embodiments of the present inventive concepts provide methods of fabricating a pellicle structure, which methods prevent damage to a membrane.

Some embodiments of the present inventive concepts provide methods of fabricating a large-area pellicle structure.

According to some embodiments of the present inventive concepts, a method of fabricating a pellicle structure may comprise: forming a metal layer on a temporary substrate; forming a membrane on the metal layer; exposing a bottom surface of the metal layer by separating the temporary substrate from the metal layer; and exposing a bottom surface of the membrane by etching the bottom surface of the metal layer.

According to some embodiments of the present inventive concepts, a method of fabricating a pellicle structure may comprise: forming a metal catalytic layer on a temporary substrate; forming a membrane on the metal catalytic layer; forming a first support layer on a top surface of the membrane; and exposing a bottom surface of the metal catalytic layer by separating the temporary substrate from the metal catalytic layer. The first support layer may include: a body part on an edge region of the membrane; and a handling part connected to the body part. In a plan view, the handling part may be spaced apart from the membrane.

According to some embodiments of the present inventive concepts, a method of fabricating a pellicle structure may comprise: forming a metal layer on a temporary substrate; forming a membrane on the metal layer, wherein the membrane has an edge region and a central region; forming a first support layer on the edge region of the membrane; forming a second support layer on the first support layer, wherein the second support layer is spaced apart from a top surface of the membrane at the central region of the membrane; exposing a bottom surface of the metal layer by separating the temporary substrate from the metal layer; separating the second support layer from the first support layer; forming a sublimation support layer on the top surface of the membrane at the central region of the membrane; exposing a bottom surface of the membrane by etching the bottom surface of the metal layer; attaching a pellicle frame to the bottom surface of the membrane, the pellicle frame overlapping the central region of the membrane; and removing the edge region of the membrane.

BRIEF DESCRIPTION OF THE DRAWINGS

FIGS. 1A-1C, 2A-2C, 3A-3C, 4A-4D, 5A-5C, 6A-6C, 7A-7B, 8A-8B, 9A-9B, 10A-10C, 11A-11C, and 12A-12D illustrate diagrams showing methods of fabricating a pellicle structure according to some embodiments.

DETAIL PARTED DESCRIPTION OF EMBODIMENTS

Figure 1B:
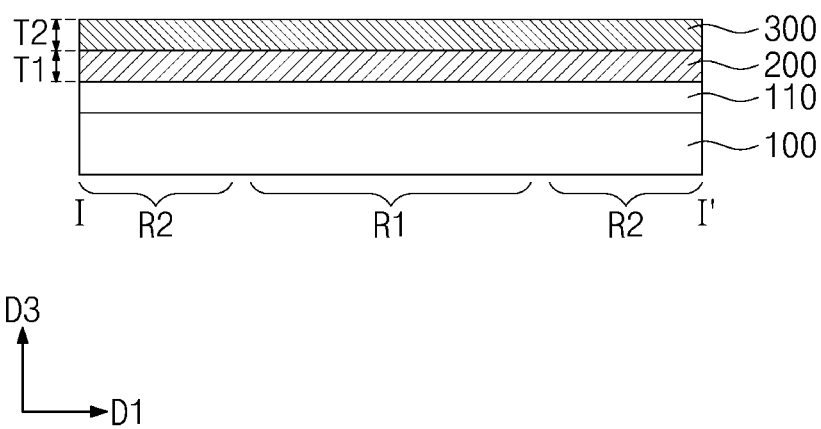

In this description, like reference numerals may indicate like components.

The following will describe methods of fabricating pellicle structures according to some embodiments and pellicle structures fabricated by the same.

FIGS. 1A to 12D illustrate diagrams showing a method of fabricating a pellicle structure according to some embodiments. FIGS. 1A, 2A, 3A, 4A, 5A, 6A, 10A, 11A, and 12A illustrate plan views showing a method of fabricating a pellicle structure according to some embodiments. FIGS. 1B, 2B, 3B, 4C, 5B, 6B, and 11B illustrate cross-sectional views taken along line I-I' of FIGS. 1A, 2A, 3A, 4A, 5A, 6A, and 11A, respectively. FIGS. 1C, 2C, 3C, 4D, 5C, 6C, and 11C illustrate cross-sectional views taken along line II-II' of FIGS. 1A, 2A, 3A, 4A, 5A, 6*a*, and 11A, respectively. FIG. 4B illustrates a cross-sectional view showing a peeling process of a temporary substrate according to some embodiments. FIG. 12B illustrates a bottom view showing a pellicle structure according to some embodiments. FIG. 12C illustrates a cross-sectional view taken along line I-I' of FIG. 12A or 12B. FIG. 12D illustrates a cross-sectional view taken along line II-II' of FIG. 12A or 12B.

Figure 1C:
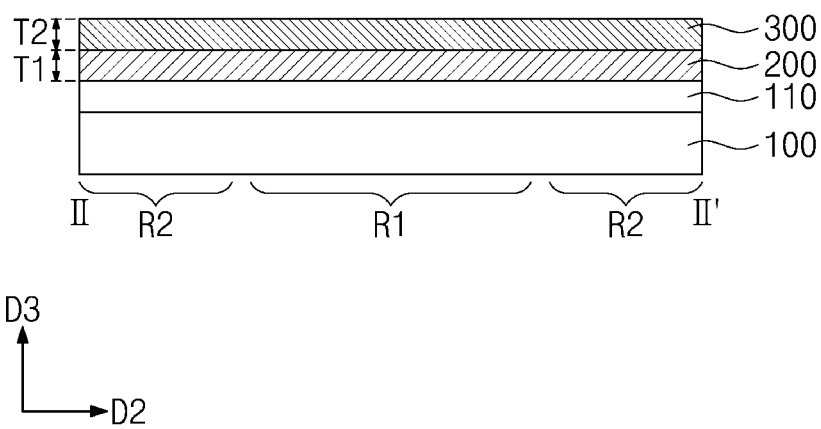

Referring to FIGS. 1A to 1C, a buffer layer 110, a metal layer 200, and a membrane 300 may be formed on a temporary substrate 100. For example, a semiconductor wafer may be used as the temporary substrate 100. The semiconductor wafer may include one or more of silicon, germanium, and silicon-germanium. The buffer layer 110 may be formed on a top surface of the temporary substrate 100. The buffer layer 110 may include semiconductor oxide, such as silicon oxide. The buffer layer 110 may have a thickness of about 100 nm to about 300 nm.

The metal layer 200 may be provided on the buffer layer 110. A sputtering process may be performed to form the buffer layer 110. The sputtering process may be executed at a power of equal to or less than about 250 W or equal to or greater than about 3.5 kW. The sputtering process may be carried out at a pressure of equal to or less than about 6 mTorr. The metal layer 200 may be a metal catalytic layer. The metal layer 200 may include nickel (Ni), but the present inventive concepts are not limited thereto. The metal layer 200 may further include an auxiliary metallic material. The auxiliary metallic material may include, for example, aluminum (Al) or molybdenum (Mo). The auxiliary metallic material in the metal layer 200 may have a content of equal to or less than about 4 at % (atomic percentage). The phrase "the content of the auxiliary metallic material is 0 at %" may mean that the auxiliary metallic material is not included. The metal layer 200 may have a thickness T1 of about 400 nm to about 5 μm. The metal layer 200 may have a relatively small stress. The stress may be a tensile stress or a compressive stress. The stress of the metal layer 200 may be equal to or less than about 200 MPa. For example, the metal layer 200 may have a stress of about 80 MPa to about 100 MPa.

According to some embodiments, a crystal plane and direction of the metal layer 200 may depend on a material and thickness of the buffer layer 110. The material and thickness of the buffer layer 110 may be adjusted to allow the metal layer 200 to have a desired crystal plane on its top surface. For example, the top surface of the metal layer 200 may have a (100) plane.

The membrane 300 may be formed on the metal layer 200. The membrane 300 may be formed by a deposition process in which the metal layer 200 is used as a catalyst. The deposition process may include a chemical vapor deposition (CVD) process, but the present inventive concepts are not limited thereto. The membrane 300 may include a carbon-containing material, such as one or more of graphite, graphene, and carbon nano-tube. The carbon-containing material may be crystalline or amorphous. When the membrane 300 includes a carbon-containing material, the formation of the membrane 300 may include sintering the carbon-containing material at about 650° C. to about 950° C. for about 1 minute to about 60 minutes. The formation of the membrane 300 may be executed under an environment including at least one selected from $C_2H_2$, $CH_4$, $H_2$, and Ar. Alternatively, the membrane 300 may include a metallic material, such as one or more of zirconium and molybdenum.

In an embodiment, the membrane 300 may be a single layer. In this case, the membrane 300 may include a carbon-containing material or a metallic material. Alternatively, the membrane 300 may have multiple layers. When the membrane 300 has multiple layers, one of the layers in the membrane 300 may include a carbon-containing material, and another layer in the membrane 300 may include a metallic material. For another example, a plurality of layers included in the membrane 300 may include different kinds of carbon-containing materials or different kinds of metallic materials. The membrane 300 may have a thickness T2 less than the thickness T1 of the metal layer 200. For example, the thickness T2 of the membrane 300 may range from about 1 nm to about 200 nm.

According to some embodiments, properties of the membrane 300 may be adjusted based on crystalline properties of the metal layer 200. The top surface of the metal layer 200 may have a (100) plane, and the membrane 300 may have desired optical properties. For example, the membrane 300 may have a D/G ratio of equal to or greater than about 0.05. The D/G ratio is a ratio of G-band to D-band in the Raman spectrum. The D-band may be a value obtained from sp2-bonded carbon atoms, and the G-band may be a value obtained from defects in carbon. The membrane 300 may have EUV transmittance of equal to or greater than about 80%. The membrane 300 may have EUV reflectance of equal to or less than about 0.04%. The membrane 300 may have 3-sigma of equal to or less than about 1%.

The membrane 300 may have a central region R1 and an edge region R2. In a plan view, the edge region R2 of the membrane 300 may surround the central region R1 of the membrane 300, as illustrated in FIG. 1A. In a plan view, the edge region R2 of the membrane 300 may be provided between the central region R1 and lateral surfaces of the membrane 300, as illustrated in FIG. 1A.

A first direction D1 may be parallel to a top surface of the membrane 300. A second direction D2 may be parallel to the top surface of the membrane 300 and substantially orthogonal to the first direction D1. A third direction D3 may be substantially perpendicular to the top surface of the membrane 300. A thickness of a certain component may be measured in a direction parallel to the third direction D3. The term "perpendicular" may include the meaning of "parallel to the third direction D3."

Figure 2A:
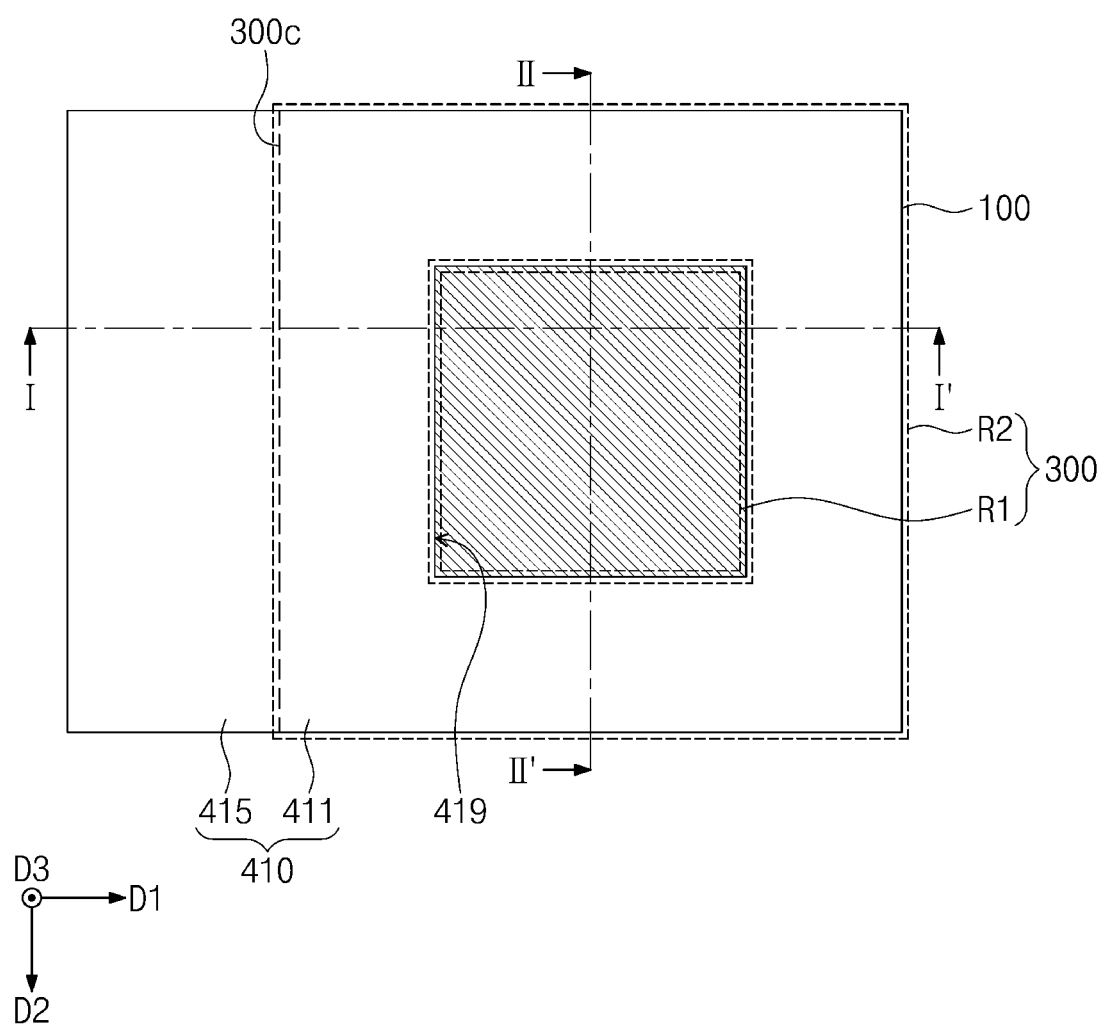
Figure 2B:
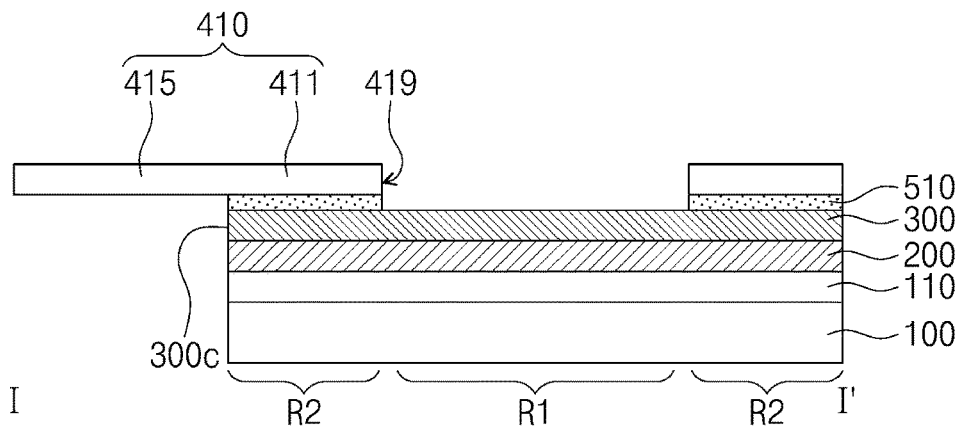
Figure 2B:
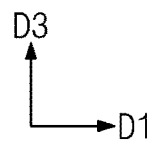
Figure 2C:
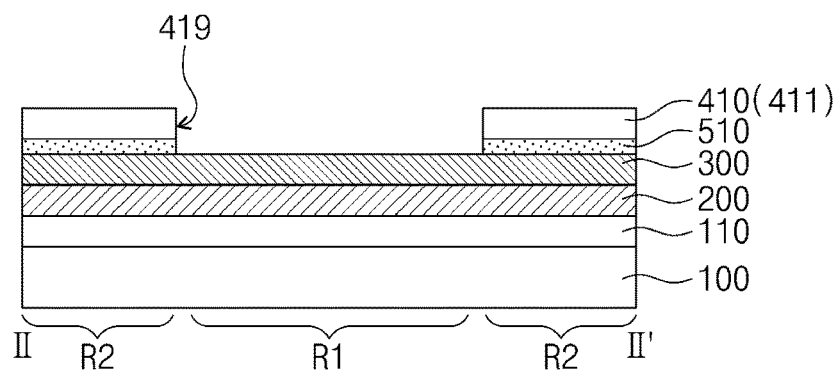
Figure 2C:
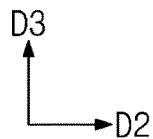

Referring to FIGS. 2A to 2C, a first support layer 410 may be provided on the top surface at the edge region R2 of the membrane 300. The first support layer 410 may include a body part 411 and a handling part 415. The body part 411 may be disposed on the top surface at the edge region R2 of the membrane 300. The handling part 415 and the body part 411 may be connected without an interface therebetween. The handling part 415 may horizontally extend from the body part 411. The term "horizontally" may include the meaning of "parallel to the top surface of the membrane 300." When viewed in plan, the handling part 415 may be spaced apart from the membrane 300. When viewed in plan, the handling part 415 may be provided on one side 300c of the membrane 300. For example, when viewed in plan, the handling part 415 may protrude toward a direction opposite to the first direction D1 from the one side 300c of the membrane 300.

The first support layer 410 may have a hole or opening 419 therein. The opening 419 may penetrate top and bottom surfaces of the first support layer 410. When viewed in plan, the opening 419 may be provided on the central region R1 of the membrane 300. Therefore, the first support layer 410 may not be provided on the top surface at the central region R1 of the membrane 300.

The first support layer 410 may include polymer or resin. For example, the first support layer 410 may include at least one selected from polyethylene terephthalate (PET, $(C_{10}H_8O_4)n$), polyimide (PI), polymethyl methacrylate (PMMA), polycarbonate (PC), and polypropylene (PP). The formation of the first support layer 410 may include attaching a resin film. The first support layer 410 may have relatively high yield strength. The first support layer 410 may be transparent, but the present inventive concepts are not limited thereto. The first support layer 410 may serve as an adhesive, but the present inventive concepts are not limited thereto. The first support layer 410 may have a thickness of about 50 μm to about 500 μm.

A first adhesion layer 510 may be interposed between the first support layer 410 and the edge region R2 of the membrane 300. The first support layer 410 may be attached through the first adhesion layer 510 to the membrane 300. The first adhesion layer 510 may include resin, such as acrylic resin, epoxy resin, or fluorine resin. The first adhesion layer 510 may have a thickness less than that of the first support layer 410. For example, the thickness of the first adhesion layer 510 may range from about 1 μm to about 10 μm.

Figure 3A:
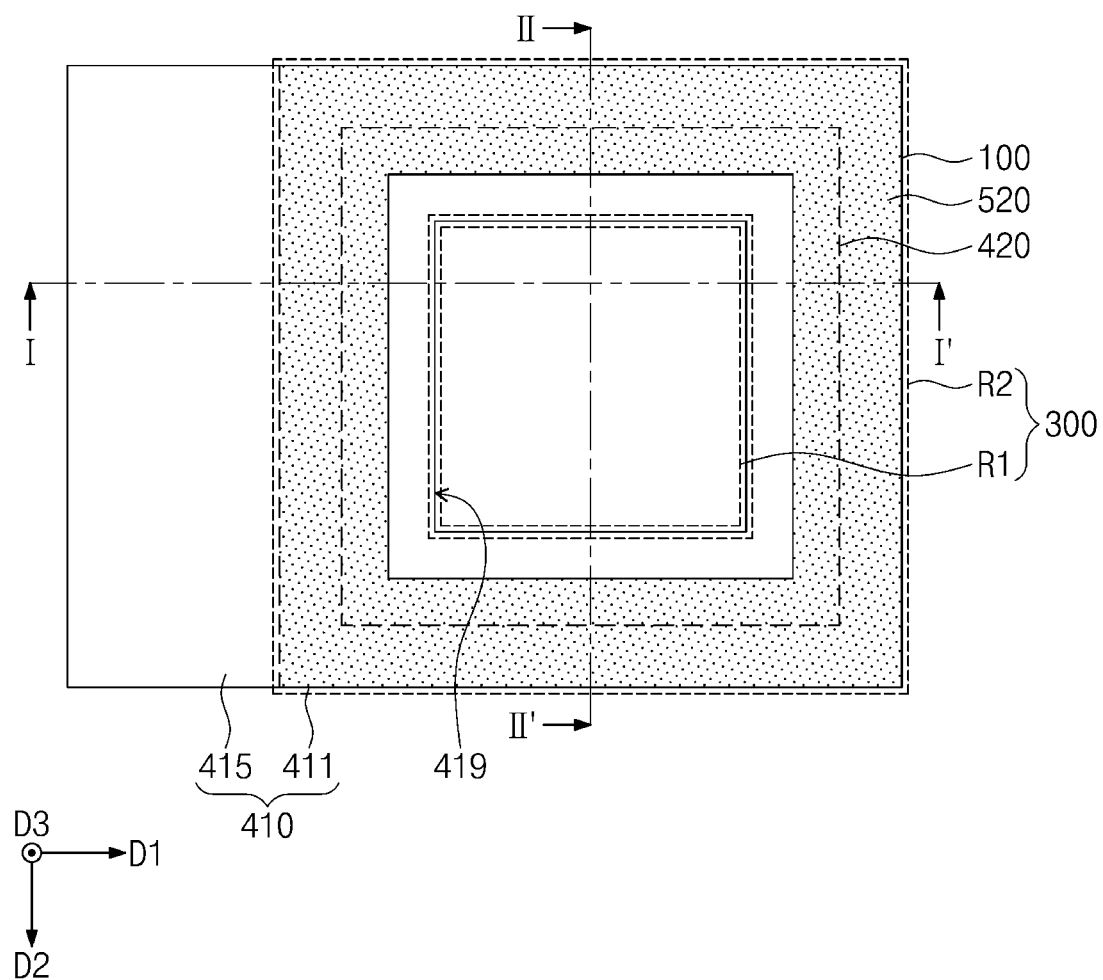
Figure 3B:
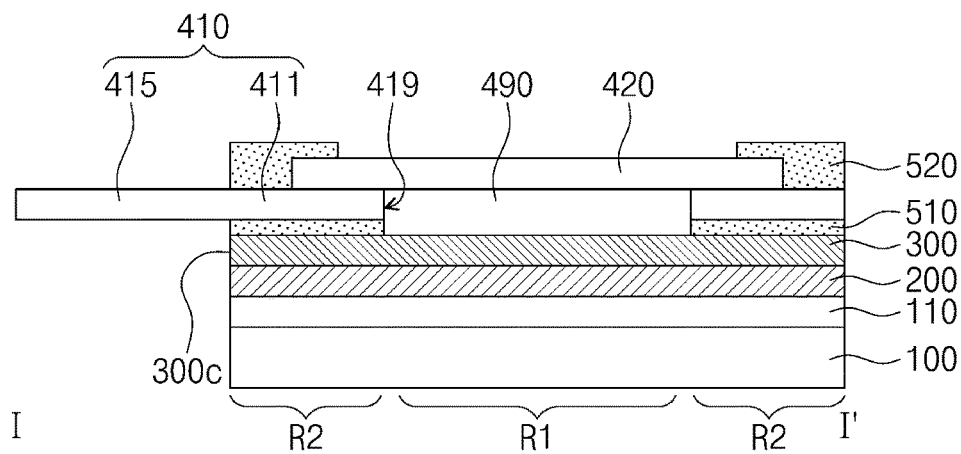
Figure 3B:
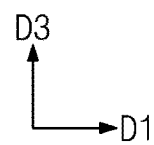
Figure 3C:
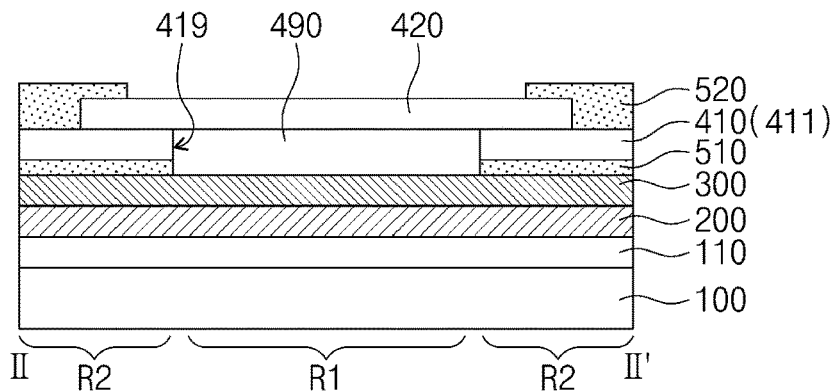
Figure 3C:
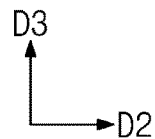
Figure 4A:
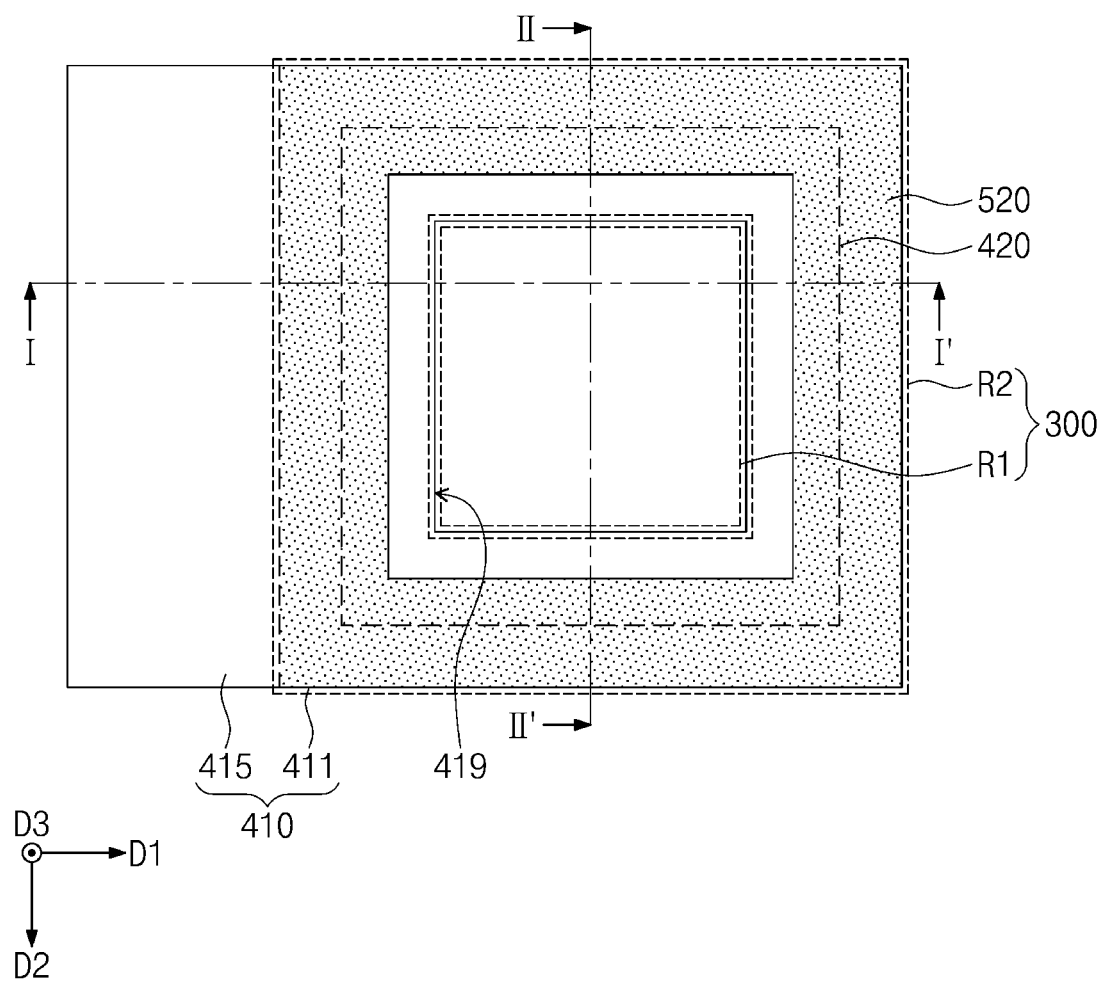
Figure 4B:
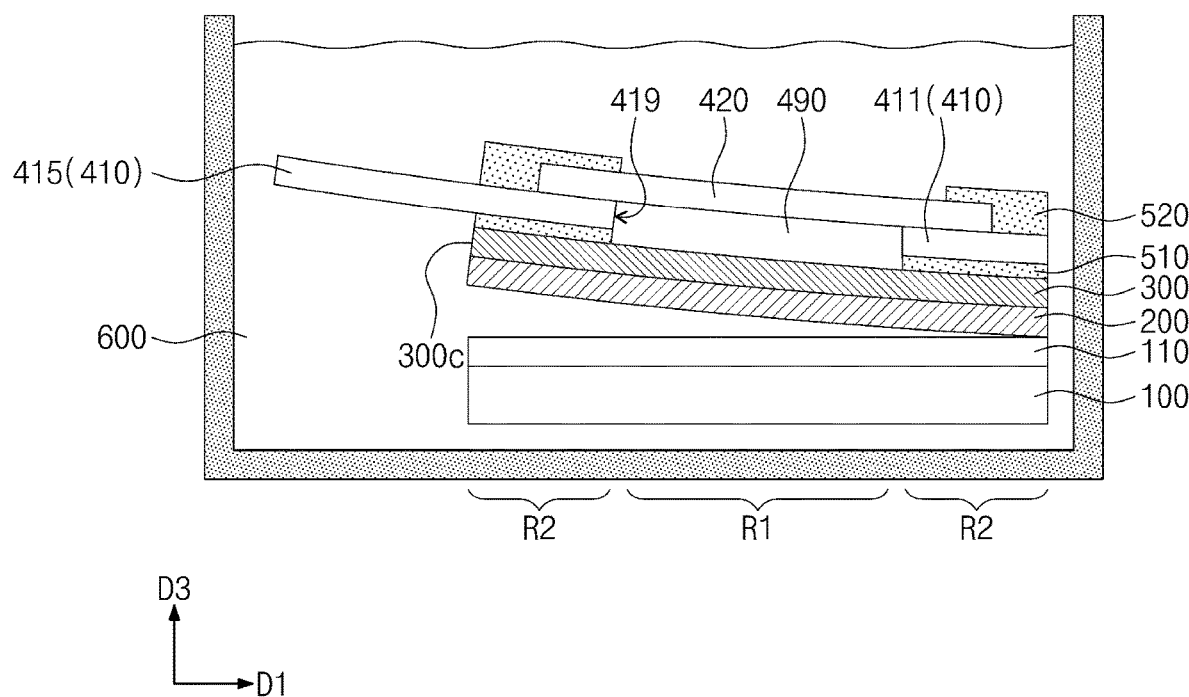

Referring to FIGS. 3A to 3C, a second support layer 420 may be disposed on the first support layer 410. The second support layer 420 may be in direct contact with the first support layer 410. The second support layer 420 may have a width and a length less than those of the membrane 300. The width and the length of the second support layer 420 may be greater than a diameter of the opening 419 in the first support layer 410. The second support layer 420 may be provided on the central region R1 of the membrane 300, and a bottom surface of the second support layer 420 may be vertically spaced apart from the top surface at the central region R1 of the membrane 300. Therefore, an internal volume or space 490 may be provided between the membrane 300, the first support layer 410, and the second support layer 420, as illustrated in FIG. 3B. The internal space 490 may be surrounded by the membrane 300, the first adhesion layer 510, the first support layer 410, and the second support layer 420. The internal space 490 may coincide with the opening 419 of the first support layer 410, as illustrated in FIGS. 3B-3C. The internal space 490 may be separated from an outer space (i.e., the internal space 490 is not exposed to an external environment). The top surface of the membrane 300 at the central region R1 faces the internal space 490, as illustrated in FIGS. 3A-3B. The internal space 490 may be in a vacuum state or occupied by air. The second support layer 420 may include the material discussed in the example of the first support layer 410. The second support layer 420 may have relatively high yield strength. The second support layer 420 may have a thickness of about 50 μm to about 500 μm.

A second adhesion layer 520 may be provided on the first support layer 410 and the second support layer 420. The second adhesion layer 520 may cover a top surface of the body part 411 and top and lateral surfaces of the second support layer 420. The second adhesion layer 520 may not extend between the first support layer 410 and the second support layer 420. The formation of the second adhesion layer 520 may include attaching a glue tape onto the first and second support layers 410 and 420. The second support layer 420 may be attached through the second adhesion layer 520 to the first support layer 410. The second adhesion layer 520 may include at least one selected from the materials discussed in the example of the first adhesion layer 510. For example, the second adhesion layer 520 may have a thickness of about 1 μm to about 10 μm.

Through the processes mentioned above, a temporary structure may be formed. The temporary structure may include the temporary substrate 100, the buffer layer 110, the metal layer 200, the first support layer 410, the second support layer 420, the first adhesion layer 510, and the second adhesion layer 520.

Figure 4C:
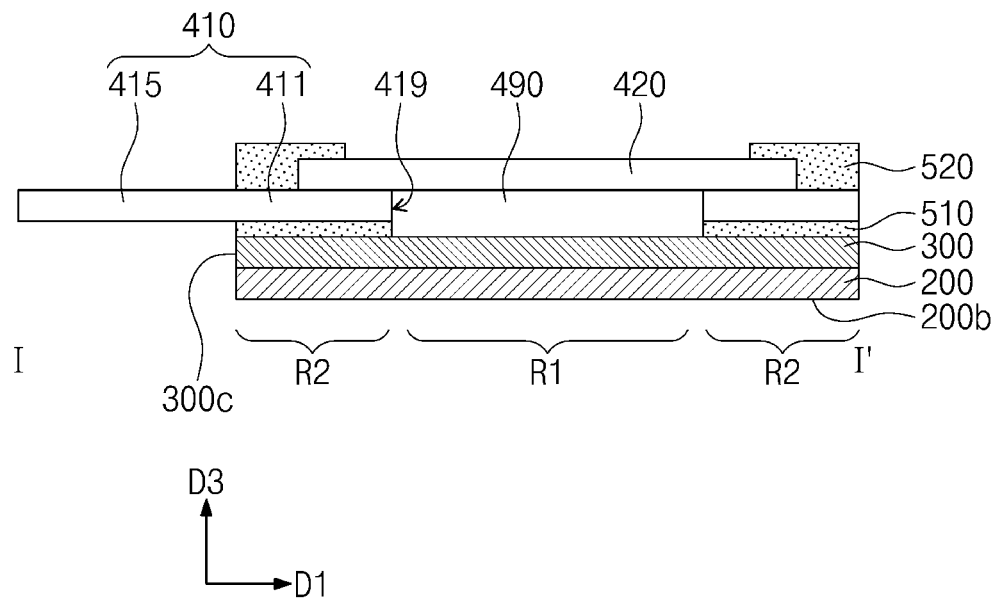
Figure 4D:
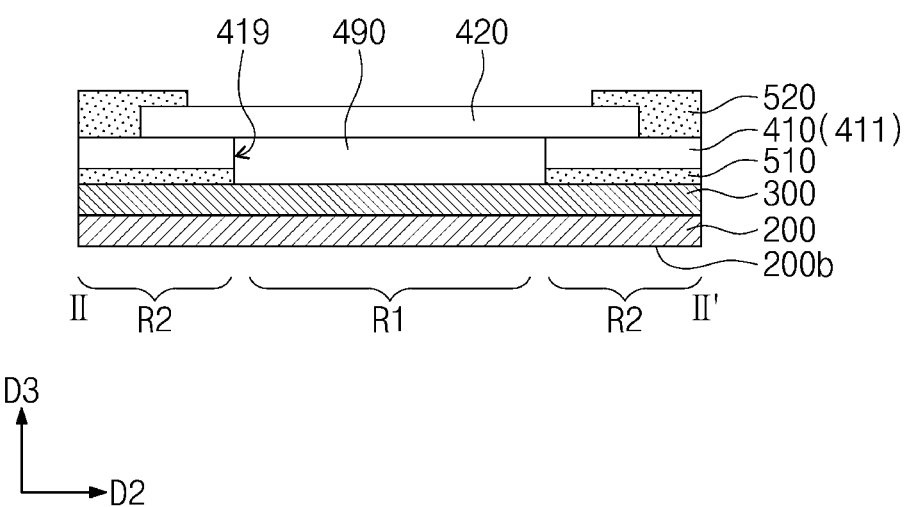

Referring to FIGS. 4A to 4D, the temporary substrate 100 may be separated from the metal layer 200 and the buffer layer 110, and thus a bottom surface 200b of the metal layer 200 may be exposed (see FIGS. 4C and 4D). Before the separation of the temporary substrate 100, the temporary structure may be provided into (i.e., submerged in) a solution 600 as shown in FIG. 4B. For example, the solution 600 may include water. For another example, the solution 600 may include alcohol. The separation of the temporary substrate 100 may be performed in the solution 600. The buffer layer 110 together with the temporary substrate 100 may be separated from the metal layer 200.

A physical method may be performed to separate the temporary substrate 100. A peeling process may be executed to accomplish the separation of the temporary substrate 100. For example, the separation of the temporary substrate 100 may include applying an external force to the handling part 415. The external force may separate the first support layer 410 from the temporary substrate 100. A bonding force between the metal layer 200 and the membrane 300 may be greater than that between the metal layer 200 and the buffer layer 110. Therefore, the external force may separate the metal layer 200 and the membrane 300 from the buffer layer 110. The metal layer 200 may be separated at a rate of about 0.1 mm/s to about 2 mm/s from the temporary substrate 100. When the metal layer 200 and the temporary substrate 100 are separated from each other at a rate greater than about 2 mm/s, the membrane 300 may be damaged in the peeling process. The separation rate between the metal layer 200 and the temporary substrate 100 may indicate a separation rate between the metal layer 200 and the buffer layer 110.

The solution 600 may enter an interface between the buffer layer 110 and the metal layer 200 to reduce a bonding force between the buffer layer 110 and the metal layer 200. The solution 600 may decrease a peeling stress between the buffer layer 110 and the metal layer 200. Because the separation of the temporary substrate 100 and the buffer layer 110 from the metal layer 200 is performed in the solution 600, the buffer layer 110 may be satisfactorily separated from the metal layer 200. Therefore, during the peeling process, the membrane 300 may be prevented from being damaged. The first and second support layers 410 and 420 may have their relatively high yield strength, and the membrane 300 may be further prevented from being damaged during the peeling process.

When the membrane 300 directly contacts the solution 600, a chemical reaction may occur at a contact surface between the solution 600 and the membrane 300. For example, the chemical reaction may include an oxidation reaction of the membrane 300. According to some embodiments, the first and second support layers 410 and 420 may not allow the solution 600 to enter the internal space 490. Thus, the membrane top surface at the central region R1 of the membrane 300 may not be exposed to the solution 600. The metal layer 200 may not allow the solution 600 to contact a bottom surface 300b at the central region R1 of the membrane 300. It may thus be possible to prevent the occurrence of an undesired chemical reaction on the central region R1 of the membrane 300.

During the separation of the temporary substrate 100, the membrane 300 may not be damaged even when the membrane 300 has a large planar area. Therefore, there may be a reduction in limitation imposed on the planar area of the membrane 300. According to some embodiments, a method of fabricating a pellicle structure may be used to manufacture the large-area membrane 300.

Figure 5A:
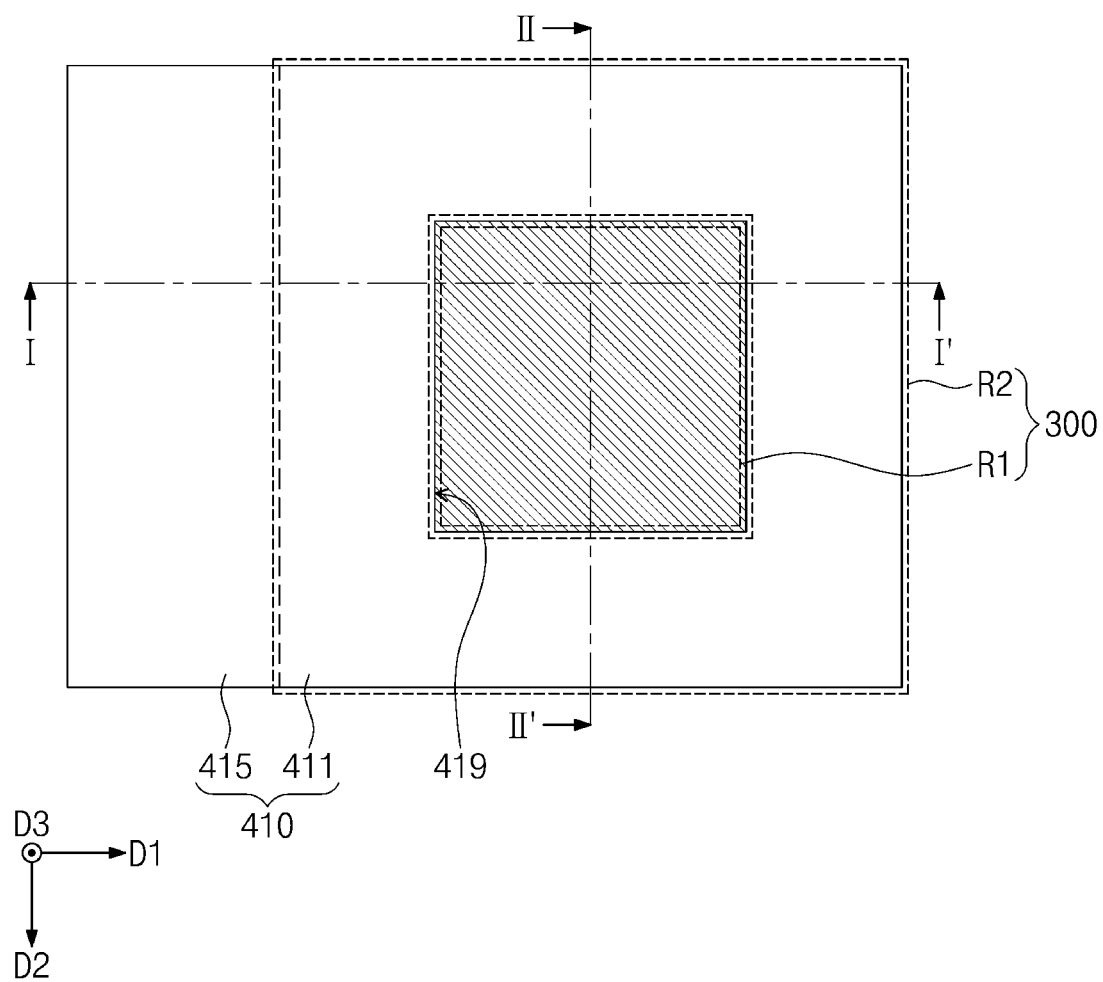
Figure 5B:
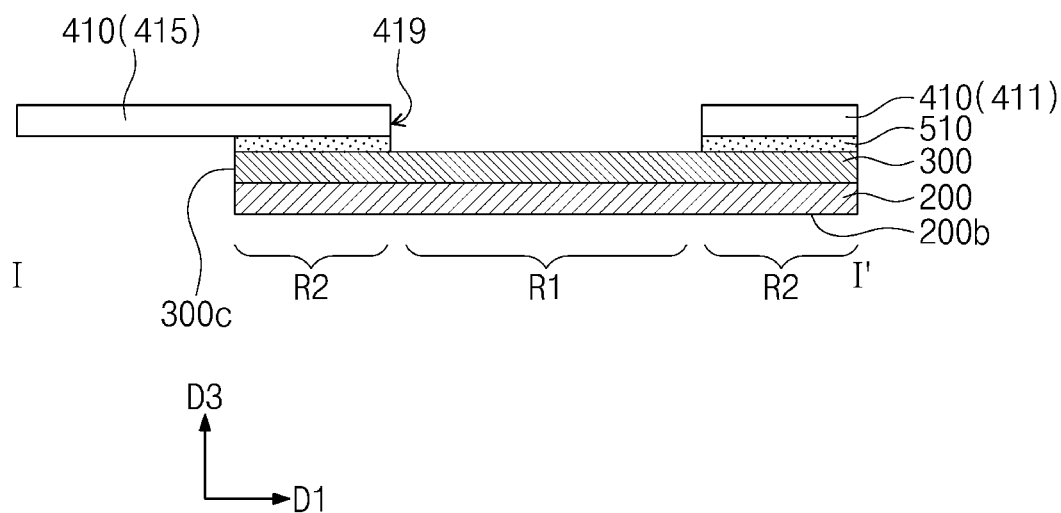
Figure 5C:
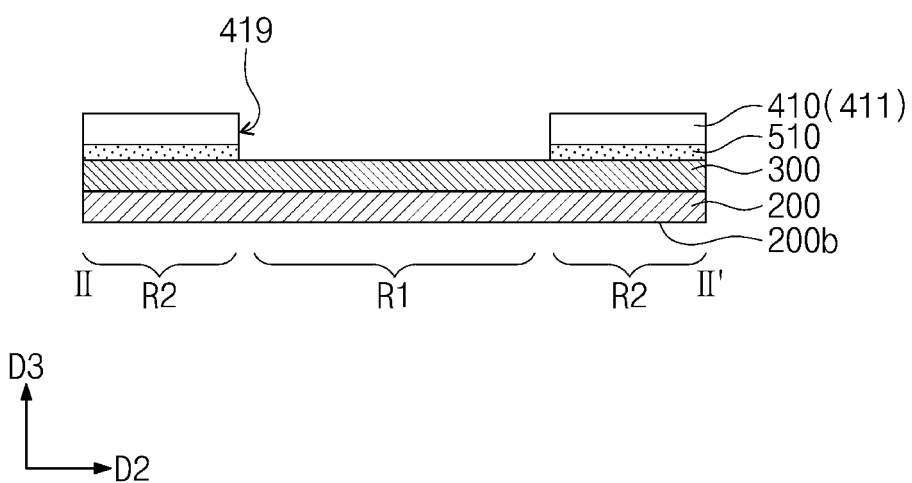

Referring to FIGS. 5A to 5C, the second adhesion layer 520 and the second support layer 420 may be removed. Because the second adhesion layer 520 does not extend between the first support layer 410 and the second support layer 420, the second support layer 420 may be easily separated from the first support layer 410. The removal of the second support layer 420 may expose the top surface at the central region R1 of the membrane 300, and may also expose the top surface of the body part 411 of the first support layer 410.

Figure 6A:
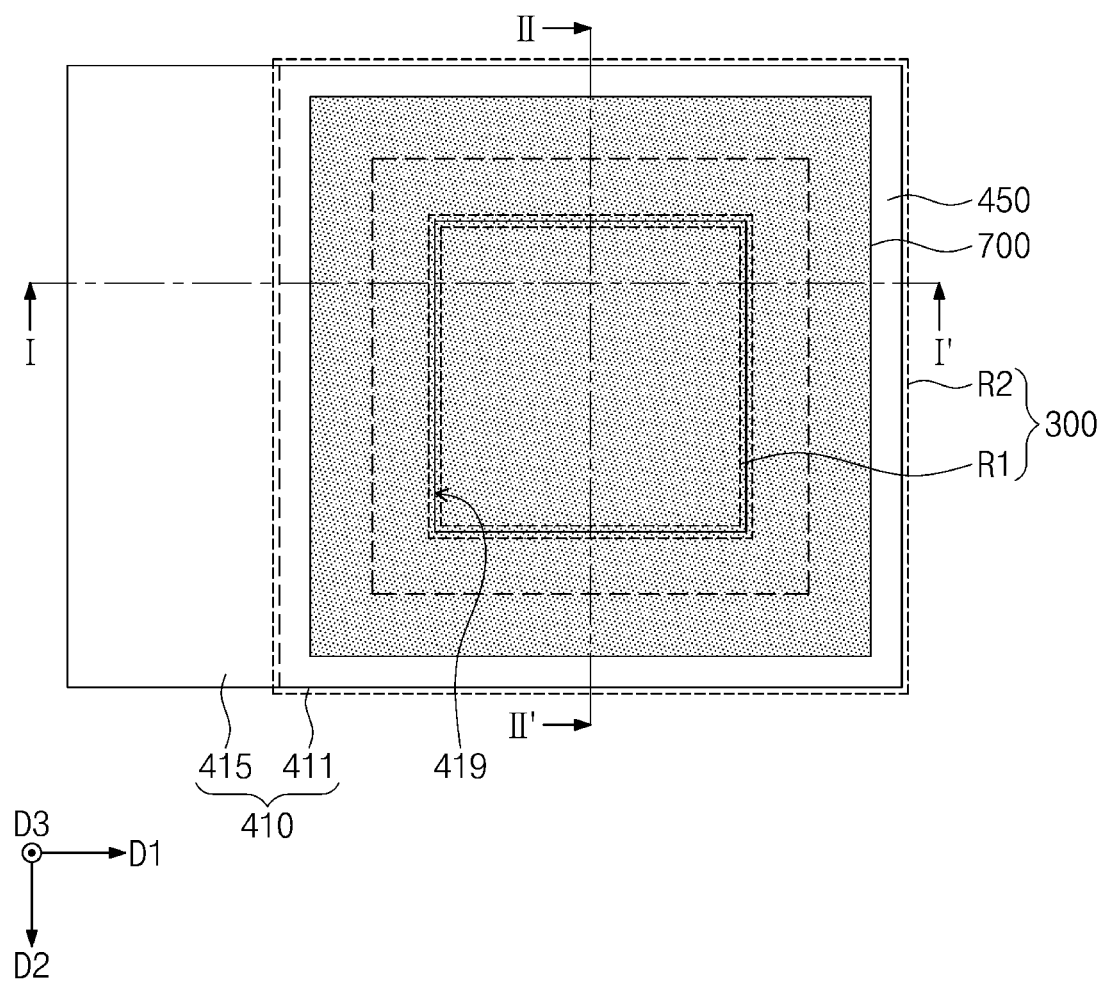
Figure 6B:
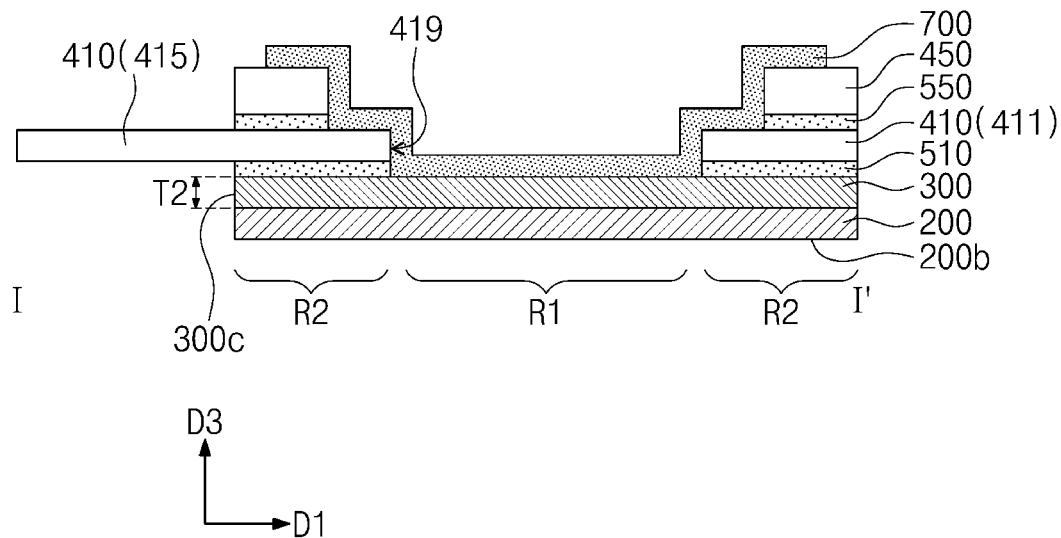
Figure 6C:
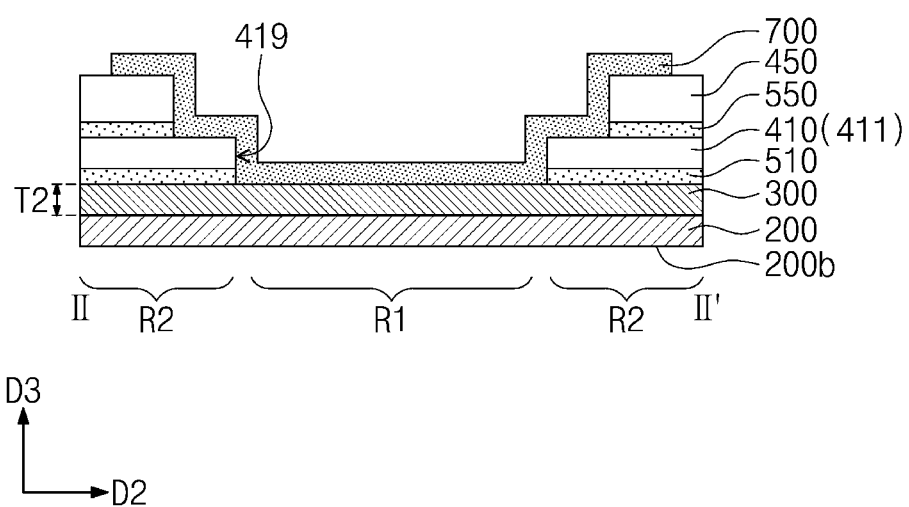
Figure 7A:
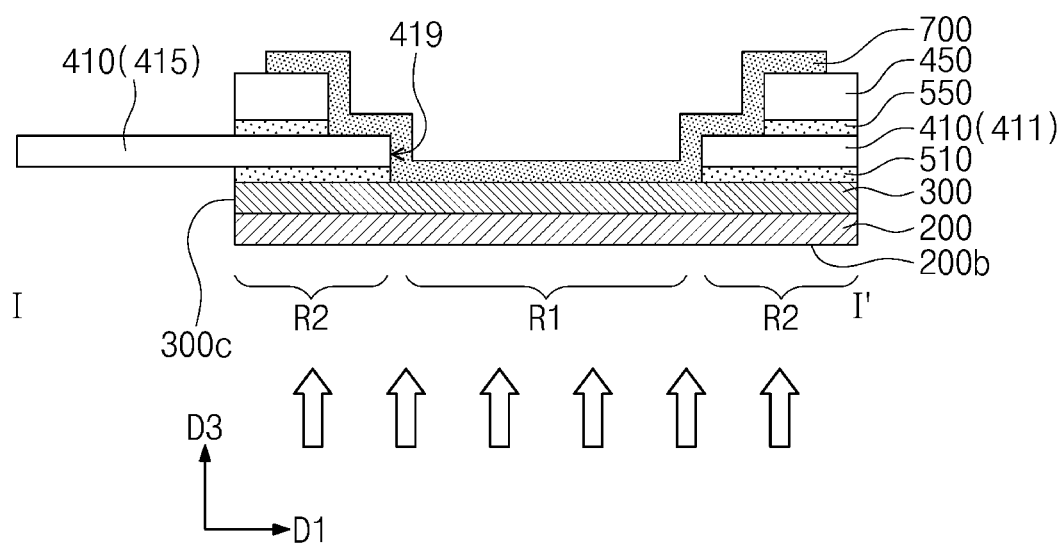
Figure 7B:
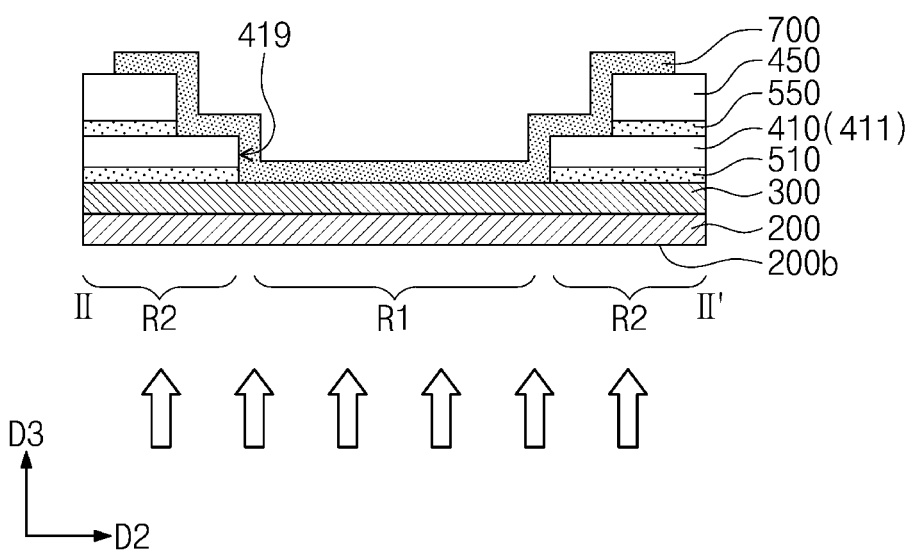

Referring to FIGS. 6A to 6C, an upper frame 450 may be formed on the first support layer 410. The upper frame 450 may be provided on the body part 411 of the first support layer 410. The upper frame 450 may not be provided on the handling part 415 of the first support layer 410. The upper frame 450 may expose at least a portion of the body part 411 and the top surface at the central region R1 of the membrane 300. The upper frame 450 may include a metallic material, such as one or more of aluminum and stainless steels (SUS). The upper frame 450 may fix the first support layer 410 and the membrane 300 in subsequent processes.

An upper adhesion layer 550 may further be formed between the first support layer 410 and the upper frame 450. The upper frame 450 may be attached through the upper adhesion layer 550 to the first support layer 410. The upper adhesion layer 550 may include the material discussed in the example of the first adhesion layer 510.

A sublimation support layer 700 may be formed on the membrane 300 to cover the top surface at the central region R1 of the membrane 300. The sublimation support layer 700 may further extend onto the first support layer 410 and a sidewall of the opening 419. For example, the sublimation support layer 700 may further cover inner sidewalls of the first adhesion layer 510, inner sidewalls of the first support layer 410, a top surface of the first support layer 410, inner sidewalls of the upper adhesion layer 550, inner sidewalls of the upper frame 450, and a top surface of the upper frame 450, as illustrated in FIGS. 6B-6C. The formation of the sublimation support layer 700 may be performed by a deposition process, such as vapor deposition. A thickness of the sublimation layer 700 is smaller than the thickness T2 of the membrane 300 and the thickness T1 of the metal layer 200. According to some embodiments, as the sublimation support layer 700 is formed, the membrane 300 may be easily processed without damage in subsequent processes. The sublimation support layer 700 may be caused to easily transfer and handle the membrane 300.

The sublimation support layer 700 may include a hydrocarbon compound. For example, the sublimation support layer 700 may include camphor. For another example, the sublimation support layer 700 may include camphene, menthol (2-isopropyl-5-methylcyclohexanol), thymol, naphthalene, 1,7-naphthalenediol, ferrocene (i.e., bis(cyclopentadienyl)iron), toluene, bromo-nitrobenzene, paradichlorobenzene (i.e., 1,4-dichlorobenzene), 2-diazo-5,5-dimethylcyclohexane-1,3-dione, borneol (i.e., 1,7,7-trimethylbicyclo[2.2.1]heptan-2-ol), butyramide, valeramide (i.e., pentanamide), 4-tert-butylphenol, furan-2-carboxylic acid, succinic anhydride, 1-adamantanol, 2-adamantanone, adamantine, endotrimethylenenorbornane, cyclododecane, trimethylnorbornane, norbornane, dimethyl fumarate, benzoic acid, trioxymethylene, coumarin (i.e., 1-benzopyran-2-one), caprolactam, 1,4-cyclohexanediol, phthalide (i.e., isobenzofuran-1(3H)-one), lactide, triisopropyltrioxane, or any combination thereof.

Figure 8A:
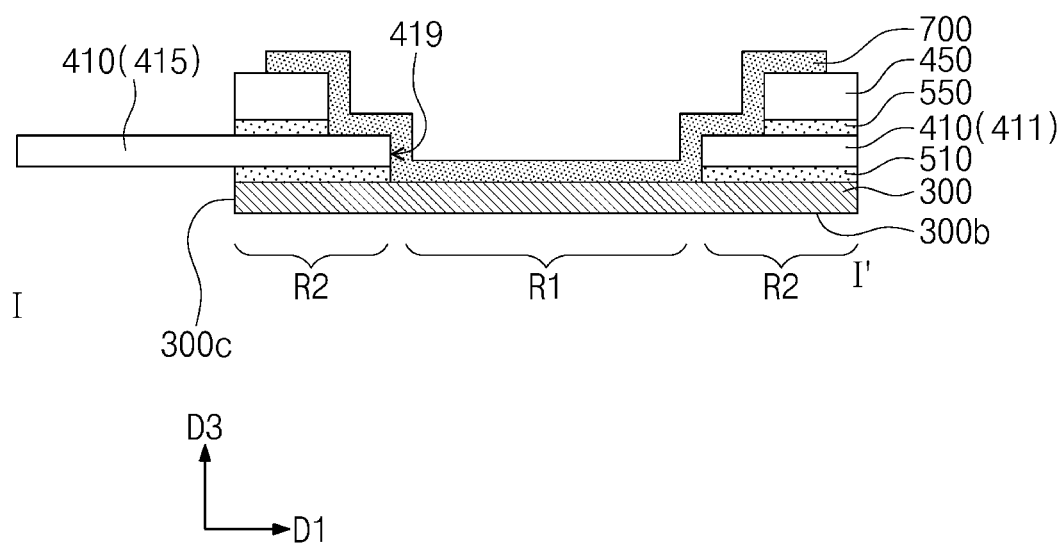
Figure 8B:
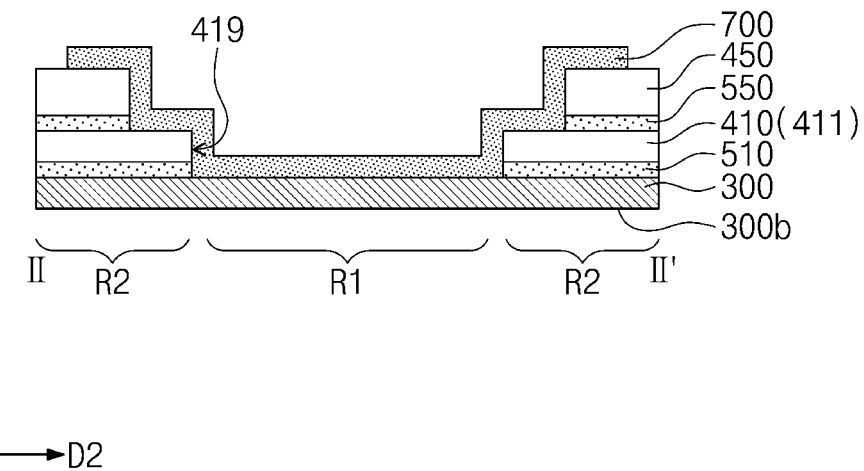

Referring to FIGS. 7A, 7B, 8A, and 8B, the bottom surface 200b of the metal layer 200 may undergo an etching process to remove the metal layer 200. A wet etching process may be adopted as the etching process. An etchant, such as a ferric chloride (FeCl₃) aqueous solution, may be used during the etching process. When the etching process is performed in the state where the temporary substrate 100 is provided on the bottom surface 200b of the metal layer 200 as shown in the example of FIGS. 3A to 3C, the etchant may contact lateral surfaces of the metal layer 200. In this case, the etching process of the metal layer 200 may consume a long time, and the membrane 300 may be damaged in the etching process. According to some embodiments, after the temporary substrate 100 is removed as shown in the example of FIGS. 4A to 4D, the etching process may be performed on the exposed bottom surface 200b of the metal layer 200. The etchant may directly contact the bottom surface 200b of the metal layer 200. The etchant may further contact the lateral surfaces of the metal layer 200. Therefore, a contact area between the metal layer 200 and the etchant may be increased such that the metal layer 200 may be more promptly and uniformly etched. For example, the bottom surface 200b of the metal layer 200 on the central region R1 of the membrane 300 may be etched substantially simultaneously with the bottom surface 200b of the metal layer 200 on the edge region R2 of the membrane 300. The etching process may be performed for a time length equal to or less than about 15 minutes, for example, between about 5 minutes and about 15 minutes. The membrane 300 may therefore be prevented from being damaged during the etching process of the metal layer 200. As shown in FIGS. 8A and 8B, the removal of the metal layer 200 may expose the bottom surface 300b of the membrane 300.

According to some embodiments, the etching process may consume a relatively small amount of time, and thus even if the membrane 300 has a large planar area, the membrane 300 may not be damaged during the etching process. There may be a reduction in limitation imposed on the planar area of the membrane 300. According to some embodiments, a method of fabricating a pellicle structure may be used to manufacture the large-area membrane 300.

After the etching process, a cleaning process may further be performed on the exposed bottom surface 300b of the membrane 300. The cleaning process may be executed by using deionized water (DIW), for example.

Figure 9A:
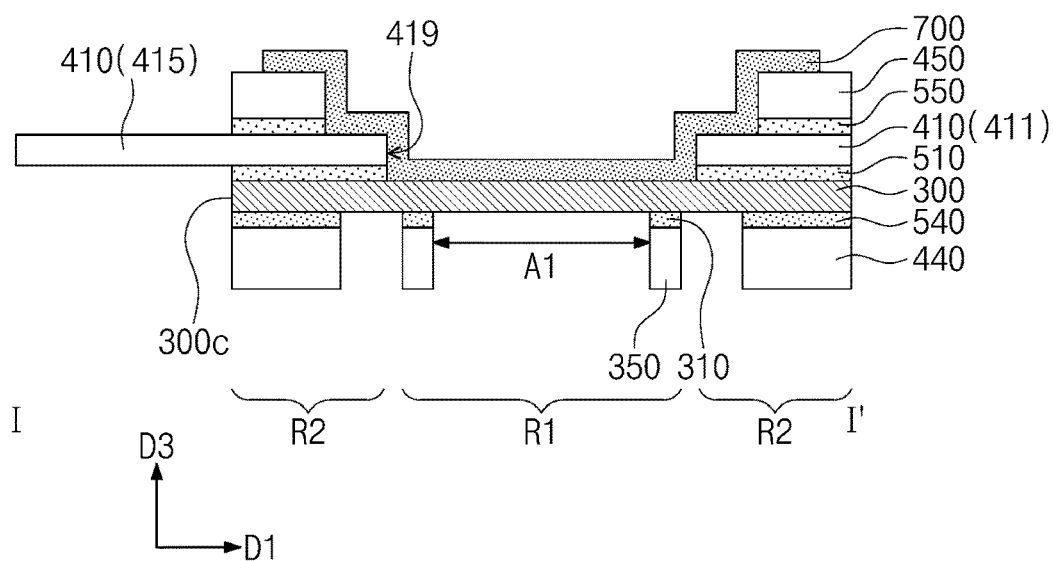
Figure 9B:
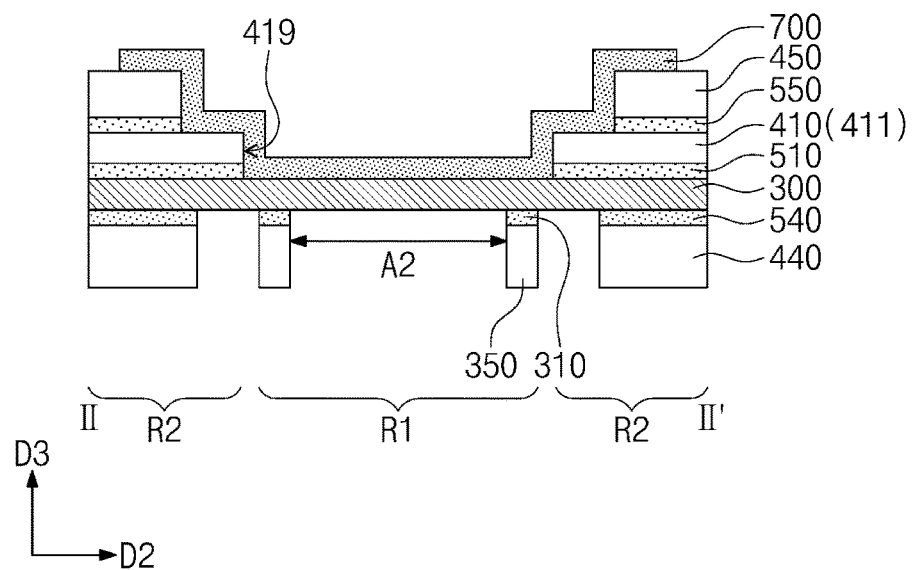

Referring to FIGS. 9A and 9B, a third support layer 440 may be formed on the exposed bottom surface 300b of the membrane 300. The third support layer 440 may be disposed on the bottom surface 300b at the edge region R2 of the membrane 300. The third support layer 440 may not be formed on the bottom surface 300b at the central region R1 of the membrane 300. The third support layer 440 may include the material discussed in the example of the first support layer 410. A third adhesion layer 540 may further be formed between the third support layer 440 and the bottom surface 300b of the membrane 300. The third support layer 440 may be attached through the third adhesion layer 540 to the membrane 300. The third adhesion layer 540 may include the material discussed in the example of the first adhesion layer 510.

A pellicle frame 350 may be formed on the bottom surface 300b at the central region R1 of the membrane 300. The pellicle frame 350 may be disposed laterally spaced apart from the third support layer 440, as illustrated in FIGS. 9A-9B. In this description, the phrase "disposed laterally" may include the meaning of "disposed horizontally." The pellicle frame 350 may include a metallic material, such as one or more of aluminum and stainless steels (SUS). The pellicle frame 350 may expose at least a portion of the bottom surface 300b at the central region R1 of the membrane 300. The pellicle frame 350 may have a polygonal or circular shape on outer and inner sidewalls thereof. For example, when viewed in plan, the pellicle frame 350 may have a tetragonal shape on its outer sidewalls as shown in FIG. 12B which will be discussed below. When viewed in plan, the pellicle frame 350 may have a tetragonal shape on its inner sidewalls as shown in FIG. 12B which will be discussed below. A range of about 100 mm to about 130 mm may be given as an interval A1 (FIG. 12B) in the first direction D1 between the inner sidewalls of the pellicle frame 350. A range of about 100 mm to about 130 mm may be given as an interval A2 (FIG. 12B) in the second direction D2 between the inner sidewalls of the pellicle frame 350. The interval A2 in the second direction D2 between the inner sidewalls of the pellicle frame 350 may be the same as or different from the interval A1 in the first direction D1 between the inner sidewalls of the pellicle frame 350.

A first adhesion pattern 310 may further be formed between the pellicle frame 350 and the membrane 300. The pellicle frame 350 may be attached through the first adhesion pattern 310 to the membrane 300. The first adhesion pattern 310 may include resin, such as acrylic resin, epoxy resin, or fluorine resin. The formation of the first adhesion pattern 310 may include attaching a resin film.

Figure 10A:
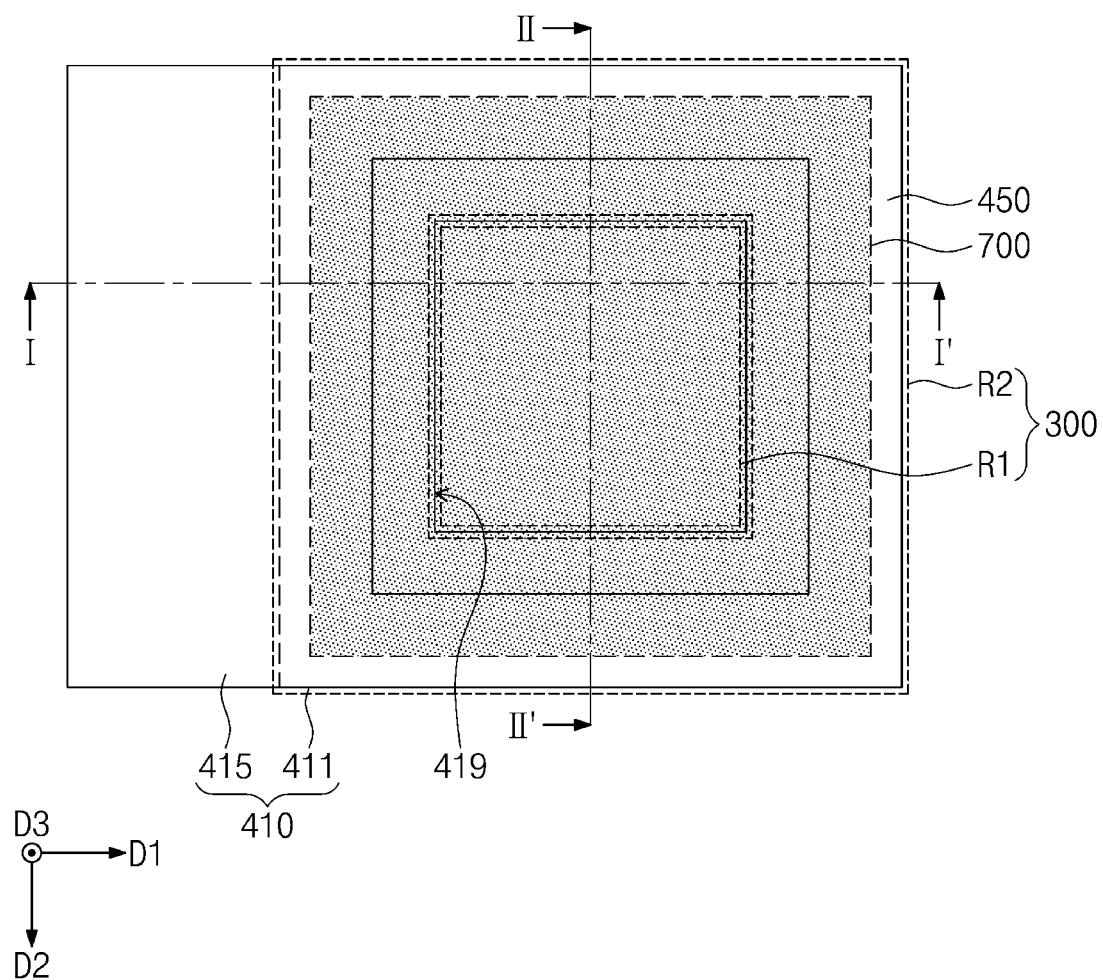
Figure 10B:
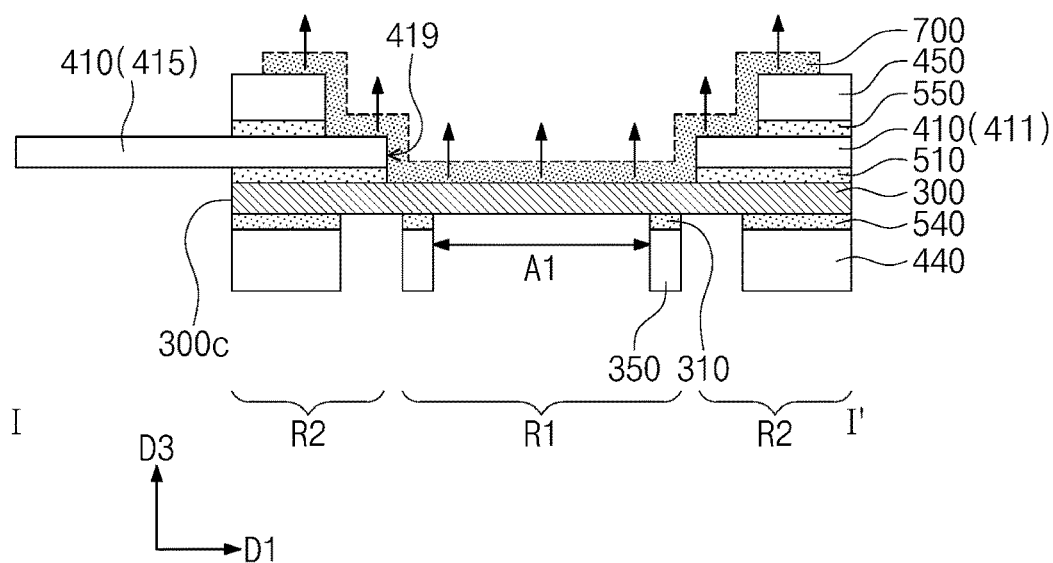
Figure 10C:
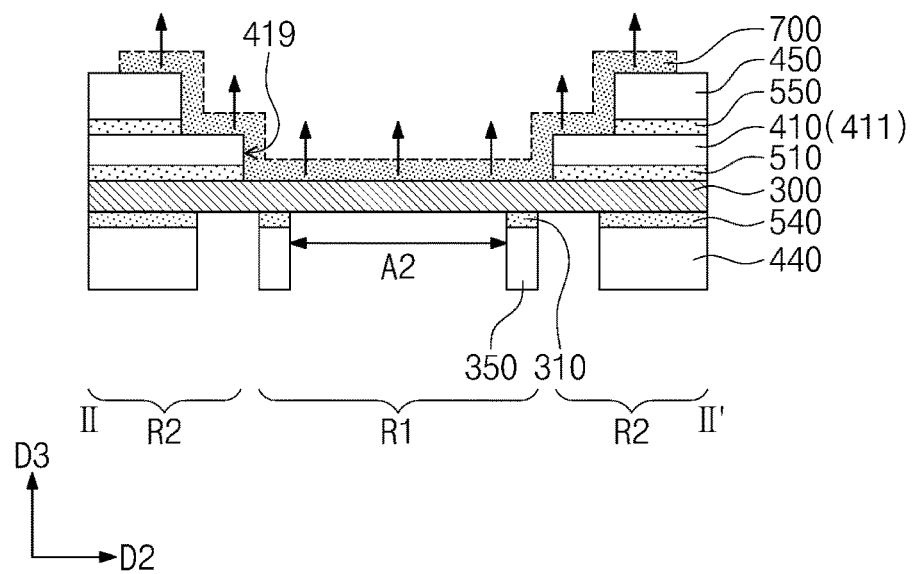

Referring to FIGS. 10A to 10C, the sublimation support layer 700 may be removed to expose the top surface at the central region R1 of the membrane 300. In addition, the upper frame 450 and the first support layer 410 may be exposed. The removal of the sublimation support layer 700 may include sublimating the sublimation support layer 700. The sublimation support layer 700 may be sublimated at a temperature ranging from about 18° C. to about 400° C., for example, from about 18° C. to about 40° C. The sublimation may be performed at an atmospheric pressure. The atmospheric pressure may range from about 700 Torr to about 800 Torr. For example, the atmospheric pressure may range from about 740 Torr to about 780 Torr.

Figure 11A:
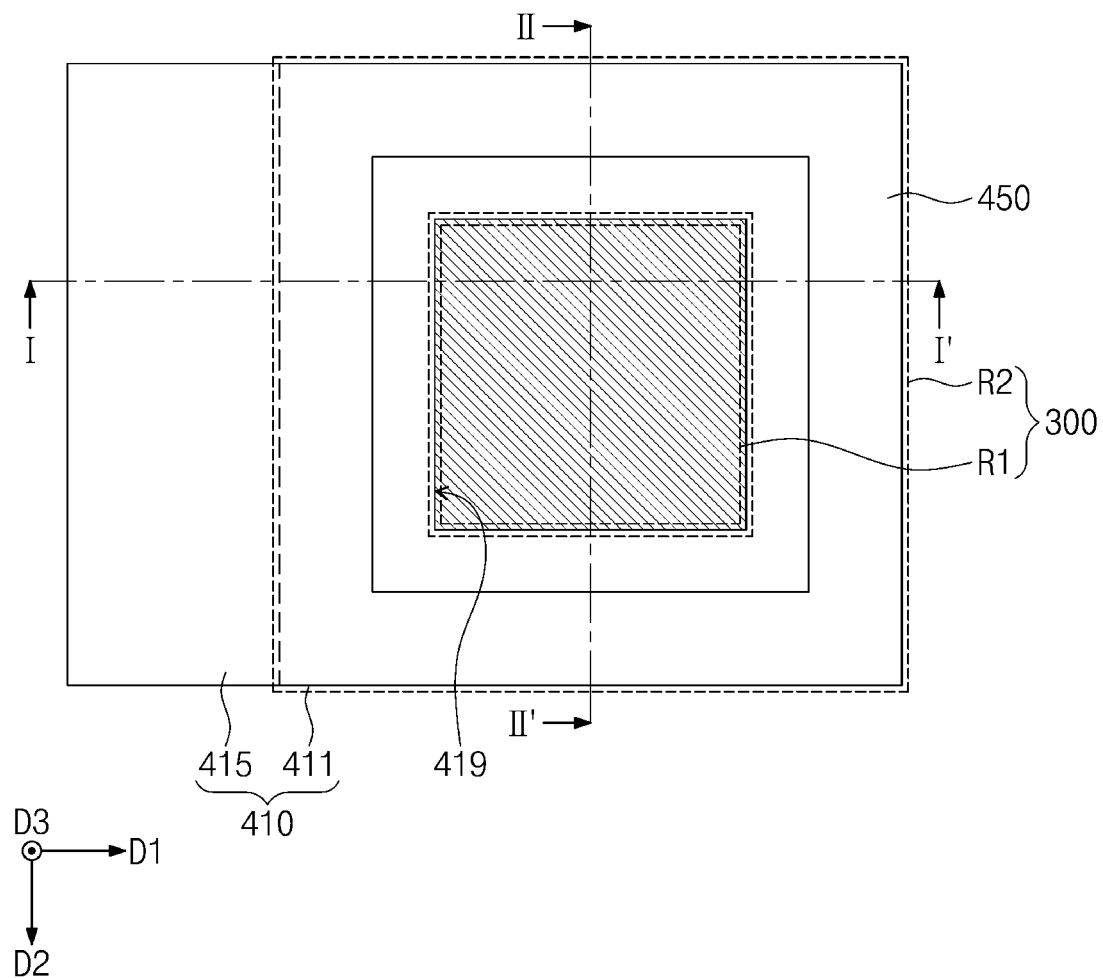
Figure 11B:
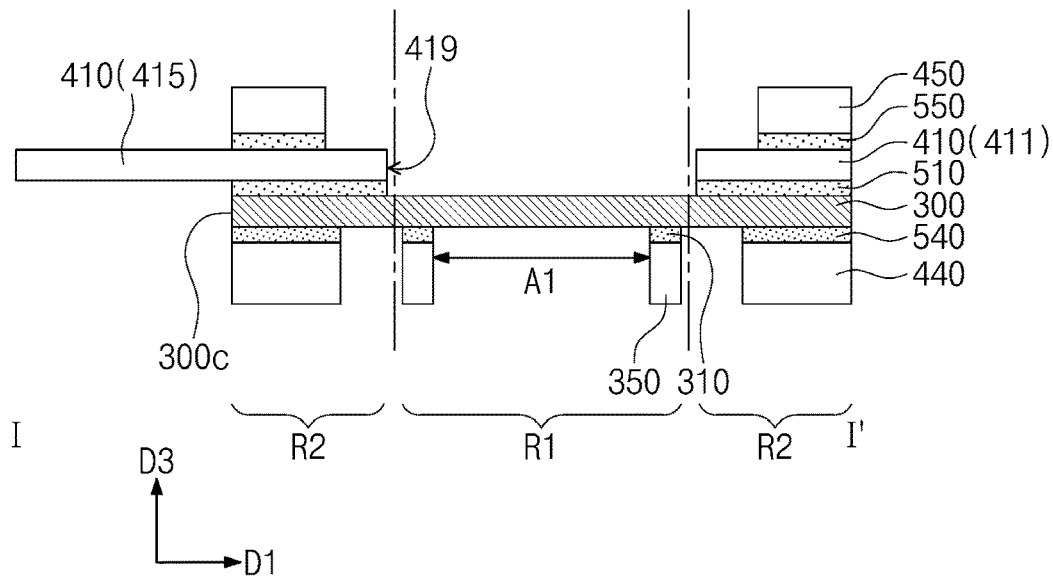
Figure 11C:
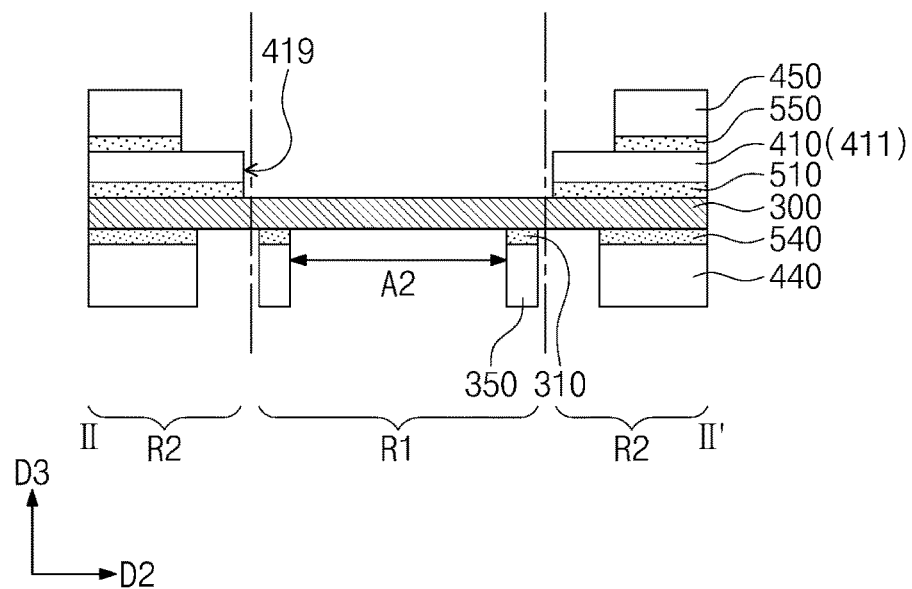
Figure 12A:
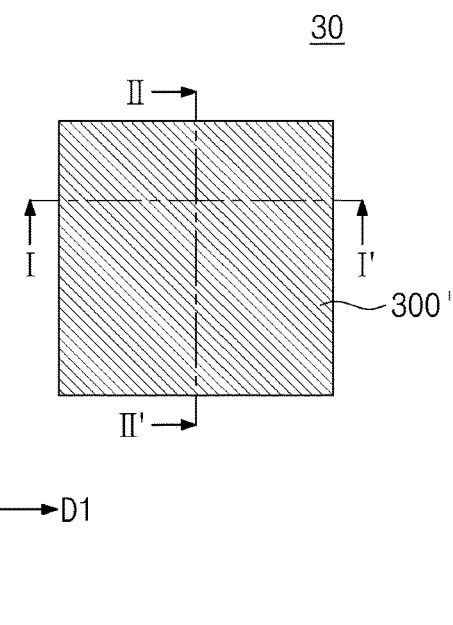
Figure 12B:
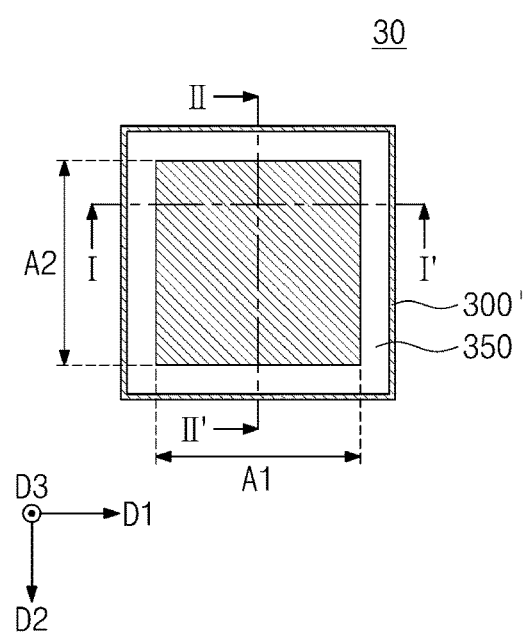
Figure 12C:
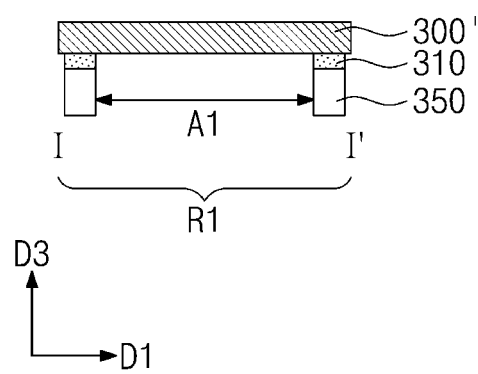
Figure 12D:
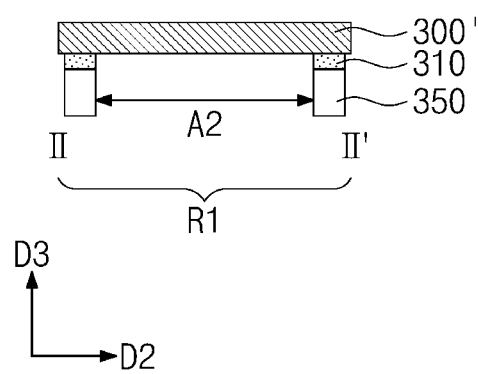

Referring to FIGS. 11A to 11C, a cutting process may be performed on the membrane 300. For example, the membrane 300 may be cut along a dash-dotted line, and thus the central and edge regions R1 and R2 of the membrane 300 may be separated from each other.

Referring to FIGS. 12A to 12D together with FIGS. 11A to 11C, the edge region R2 of the membrane 300 may be removed. In this step, the first support layer 410, the first adhesion layer 510, the upper frame 450, the upper adhesion layer 550, the third support layer 440, and the third adhesion layer 540 may be removed together with the edge region R2 of the membrane 300. The central region R1 of the membrane 300 may remain to form a pellicle membrane 300'. For example, the pellicle membrane 300' may be the separated central region R1 of the membrane 300. The pellicle frame 350 and the first adhesion pattern 310 may be disposed on a bottom surface of the pellicle membrane 300'. The first adhesion pattern 310 may be interposed between the pellicle frame 350 and the pellicle membrane 300'. A pellicle structure 30 may thus be fabricated. The pellicle structure 30 may include the pellicle membrane 300', the pellicle frame 350, and the first adhesion pattern 310. A size of the pellicle membrane 300' may be variously changed.

Figure 13:
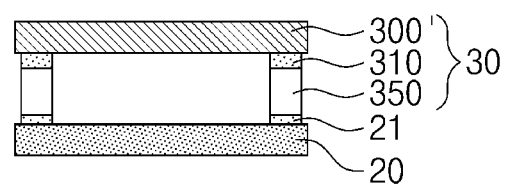
FIG. 13 illustrates a diagram showing a mask coupling structure according to some embodiments.

FIG. 13 illustrates a diagram showing a mask coupling structure according to some embodiments.

Referring to FIG. 13, a mask coupling structure 10 may include a pellicle structure 30 and a photomask 20. The pellicle structure 30 may be substantially the same as that discussed with reference to FIGS. 12A to 12D. For example, the pellicle structure 30 may include the pellicle membrane 300', the pellicle frame 350, and the first adhesion pattern 310. The mask coupling structure 10 may further include a second adhesion pattern 21. The second adhesion pattern 21 may be interposed between the pellicle frame 350 and the photomask 20. The second adhesion pattern 21 may include resin, such as acrylic resin, epoxy resin, or fluorine resin.

The photomask 20 may include, for example, an extreme ultraviolet (EUV) photomask. For example, the photomask 20 may be utilized in a photolithography process that uses an extreme ultraviolet (EUV) wavelength range, or wavelength ranging from about 13 nm to about 14 nm. The photomask 20 may have patterns on one surface thereof. For example, the patterns may include images of drawn patterns for patterning components of a semiconductor wafer or a semiconductor chip. The components of the semiconductor wafer or the semiconductor chip may be integrated circuits. The one surface of the photomask 20 may be a top surface of the photomask 20, but the present inventive concepts are not limited thereto. Light irradiated in an exposure process may further penetrate the photomask 20 and the pellicle membrane 300'.

Optical properties of the pellicle membrane 300' may be substantially the same as those discussed above in the examples of FIGS. 1A to 1C. For example, the pellicle membrane 300' may have a D/G ratio of equal to or greater than about 0.05, an extreme ultraviolet (EUV) transmittance of equal to or greater than about 80%, and an extreme ultraviolet (EUV) reflectance of equal to or less than about 0.04%.

According to some embodiments, the formation of the mask coupling structure 10 may include placing the pellicle structure 30 on the photomask 20 to allow the pellicle frame 350 to face toward the photomask 20. The second adhesion pattern 21 may be formed between the pellicle frame 350 and the photomask 20. The pellicle structure 30 may be attached through the second adhesion pattern 21 to the photomask 20.

The mask coupling structure 10 may have a cavity. The cavity may be surrounded by the photomask 20, the pellicle membrane 300', the pellicle frame 350, and the first adhesion pattern 310. The cavity may be a space occupied by air or may be a vacuum space.

According to some embodiments, the pellicle structure 30 or the mask coupling structure 10 including the pellicle structure 30 may be used for a pellicle, an optic filter, a dynamic gas lock membrane, or a protector of optics.

Figure 14:
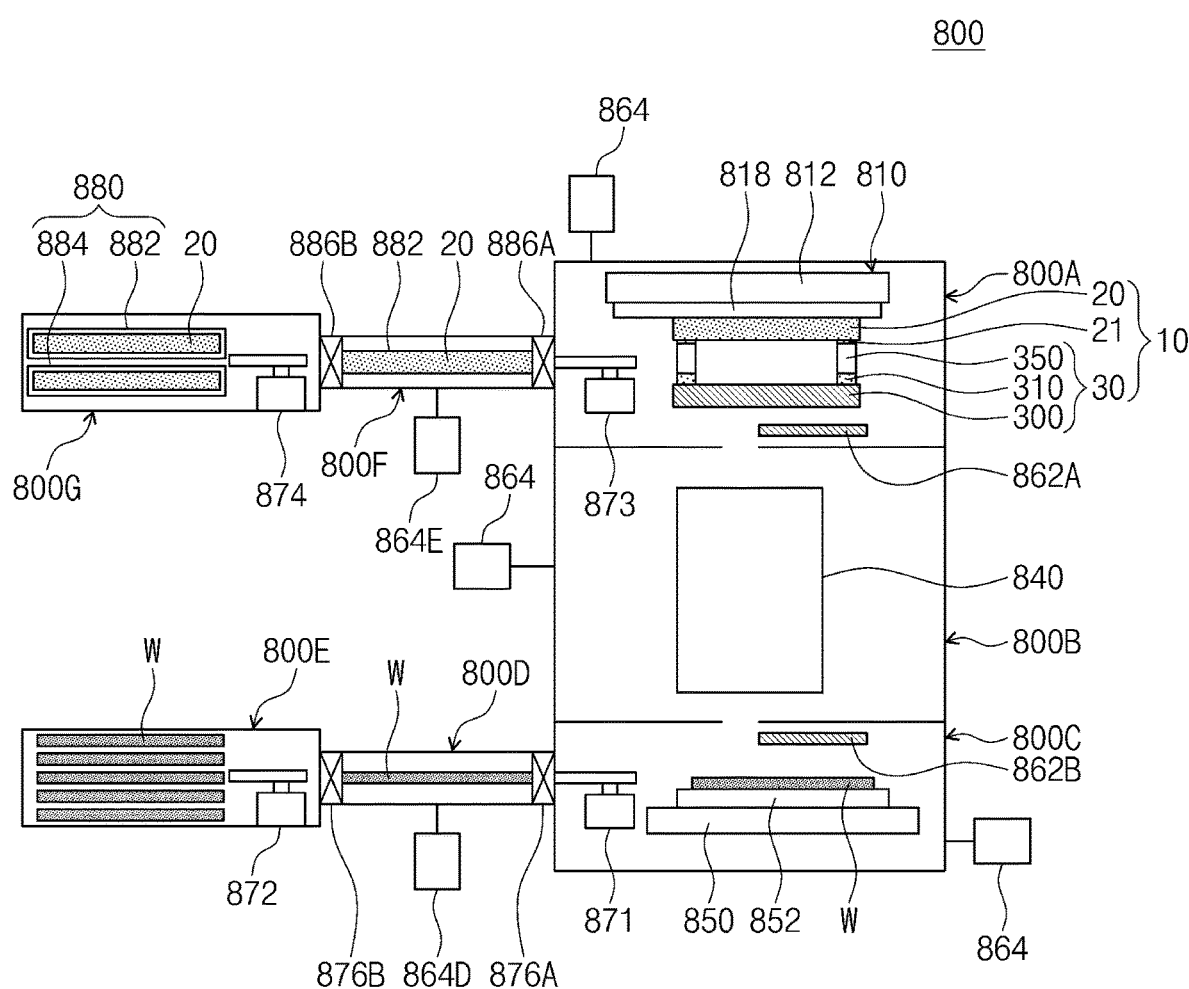
FIG. 14 illustrates a diagram showing a patterning process that uses a mask coupling structure according to some embodiments.

FIG. 14 illustrates a patterning process that uses a mask coupling structure according to some embodiments.

Referring to FIG. 14, a semiconductor fabrication facility 800 may be an exposure apparatus where light is used to contact and cause pattern images drawn on the photomask 20 to transfer onto a wafer under vacuum in a projection optical system. The light may be EUV, but the present inventive concepts are not limited thereto.

The semiconductor fabrication facility 800 may include a mask stage section 800A, a projection optical system section 800B, and a wafer stage section 800C. A mask stage 810 may be provided in the mask stage section 800A. The mask stage 810 may include a stage supporter 812 and a mask holder 818. The mask holder 818 may be provided on a bottom surface of the stage supporter 812. The mask holder 818 may serve to fix the photomask 20. For example, the mask holder 818 may include an electrostatic chuck, and the mask holder 818 may use an electrostatic force to adsorb and keep the photomask 20.

In the mask stage section 800A, a pellicle structure 30 may be fixed on one surface of the photomask 20 to constitute a mask coupling structure 10. The pellicle structure 30 may be substantially the same as that discussed in the example of FIG. 13. However, the pellicle structure 30 of FIG. 14 may be vertically symmetrical to the pellicle structure 30 of FIG. 13. Alternatively, the mask coupling structure 10 may have variously modified and/or changed structures, compared to the mask coupling structure 10 disclosed in the example of FIG. 13. The mask stage 810 may drive the photomask 20 fixed to the stage supporter 812 to move in a horizontal direction.

A wafer W, a wafer stage 850, and a wafer chuck 852 may be provided in the wafer stage section 800C. The wafer chuck 852 may be provided on the wafer stage 850. The wafer W may be fixed onto the wafer chuck 852. The wafer chuck 852 may drive the wafer W to move in a horizontal direction.

The projection optical system section 800B may be provided between the mask stage section 800A and the wafer stage section 800C. A projection optical system 840 may be disposed in the projection optical system section 800B. The projection optical system 840 may be configured such that a pattern formed on the photomask 20 is transferred to the wafer W in the wafer stage section 800C.

A first gate valve 862A may be provided to separate the mask stage section 800A and the projection optical system section 800B from each other. A second gate valve 862B may be provided to separate the projection optical system section 800B and the wafer stage section 800C from each other.

Vacuum exhaust apparatuses 864 may be correspondingly connected to the mask stage section 800A, the projection optical system section 800B, and the wafer stage section 800C. Therefore, it may be possible to independently control a pressure of the mask stage section 800A, a pressure of the projection optical system section 800B, and a pressure of the wafer stage section 800C.

The semiconductor fabrication facility 800 may further include a loadlock chamber 800D. The loadlock chamber 800D may be provided adjacent to the wafer stage section 800C. A first transfer hand 871 may be provided to connect to the wafer stage section 800C and the loadlock chamber 800D. The first transfer hand 871 may allow the wafer W to move between the wafer stage section 800C and the loadlock chamber 800D. Therefore, the wafer W may be loaded into or unloaded from the wafer stage section 800C. A first chamber vacuum exhaust apparatus 864D may further be connected to the loadlock chamber 800D.

The semiconductor fabrication facility 800 may further include a wafer loadport 800E. The wafer loadport 800E may be provided adjacent to the loadlock chamber 800D. The wafer W may be temporarily stored in the wafer loadport 800E.

A second transfer hand 872 may be provided to connect to the loadlock chamber 800D and the wafer loadport 800E. The second transfer hand 872 may allow the wafer W to move between the loadlock chamber 800D and the wafer loadport 800E. Therefore, the wafer W may be loaded into or unloaded from the loadlock chamber 800D.

A third gate valve 876A may be interposed between the wafer stage section 800C and the loadlock chamber 800D. A fourth gate valve 876B may be interposed between the loadlock chamber 800D and the wafer loadport 800E.

The semiconductor fabrication facility 800 may further include a mask loadlock chamber 800F. The mask loadlock chamber 800F may be provided adjacent to the mask stage section 800A. A third transfer hand 873 may be provided to connect to the mask stage section 800A and the mask loadlock chamber 800F. The third transfer hand 873 may allow the photomask 20 to move between the mask stage section 800A and the mask loadlock chamber 800F. The third transfer hand 873 may load or unload the photomask 20 into or from the mask stage section 800A.

The semiconductor fabrication facility 800 may further include a mask loadport 800G. The photomask 20 may be temporarily stored in the mask loadport 800G. A fourth transfer hand 874 may be provided to connect to the mask loadlock chamber 800F and the mask loadport 800G. The fourth transfer hand 874 may allow the photomask 20 to move between the mask loadlock chamber 800F and the mask loadport 800G. The fourth transfer hand 874 may load or unload the photomask 20 into or from the mask loadlock chamber 800F.

A fifth gate valve 886A may be interposed between the mask stage section 800A and the mask loadlock chamber 800F. A sixth gate valve 886B may be provided between the mask loadlock chamber 800F and the mask loadport 800G.

The photomask 20 may be stored and transferred from outside to the semiconductor fabrication facility 800, while being accommodated in a photomask carrier 880. For example, the photomask 20 may be transferred to the mask loadport 800G while the photomask carrier 880 accommodates the photomask 20. Therefore, the photomask 20 may be effectively protected from unnecessary contact with an external environment and contamination due to foreign particles. The photomask carrier 880 may include an inner pod 882 and an outer pod 884. The inner pod 882 and the outer pod 884 may serve to protect the photomask 20 when the photomask 20 is transferred.

The semiconductor fabrication facility 800 may protect the photomask 20 by using the pellicle structure 30 fabricated as discussed in the examples of FIGS. 1A to 12D. Even when the pellicle membrane 300' has a relatively large-area free-standing structure, the pellicle membrane 300' may be prevented from being damaged in fabricating the pellicle structure 30. Therefore, it may be possible to prevent or reduce the occurrence of error due to an exposure process and a reduction in flatness of the pellicle membrane 300'. Accordingly, a desired pattern shape may be effectively transferred onto an exact position on the wafer W or a semiconductor chip.

According to the present inventive concepts, it may be possible to fabricate a large-area pellicle structure. According to the present inventive concepts, it may be possible to prevent membranes from being damaged during the formation of the pellicle structure.

This detailed description of the present inventive concepts should not be construed as limited to the embodiments set forth herein, and it is intended that the present inventive concepts cover the various combinations, the modifications and variations of this invention without departing from the scope of the present inventive concepts. The appended claims should be construed to include other embodiments.

What is claimed is:

1. A method of fabricating a pellicle structure, the method comprising:
   forming a metal layer on a temporary substrate;
   forming a membrane on the metal layer;
   submerging the temporary substrate, the metal layer, and the membrane in a solution;
   exposing a bottom surface of the metal layer by physically separating the temporary substrate from the metal layer in the solution; and
   exposing a bottom surface of the membrane by etching the bottom surface of the metal layer.

2. The method of claim 1, further comprising forming a first support layer on a top surface of the membrane,
   wherein the first support layer comprises:
      a body part on an edge region of the membrane; and
      a handling part connected to the body part, the handling part extending from the body part,
   wherein, in a plan view, the handling part is spaced apart from the membrane.

3. The method of claim 2, wherein separating the temporary substrate from the metal layer comprises applying a force to the handling part of the first support layer to separate the temporary substrate from the metal layer.

4. The method of claim 1, further comprising forming a buffer layer between the metal layer and the temporary substrate,
   wherein the solution is configured to reduce a bonding force between the buffer layer and the metal layer.

5. The method of claim 1, further comprising:
   forming a first support layer on an edge region of the membrane; and
   forming a second support layer on the first support layer, wherein the second support layer is spaced apart from a central region of the membrane.

6. The method of claim 5, wherein
an internal space is formed by the first support layer, the second support layer, and the membrane,
a top surface of the membrane at the central region of the membrane faces the internal space, and
the top surface of the membrane at the central region of the membrane is not exposed to the solution.

7. The method of claim 1, further comprising attaching a pellicle frame to the bottom surface of the membrane.

8. The method of claim 1, further comprising forming a sublimation support layer on a top surface of the membrane at a central region of the membrane prior to exposing the bottom surface of the membrane.

9. The method of claim 1, further comprising forming a buffer layer between the temporary substrate and the metal layer,
wherein separating the temporary substrate from the metal layer comprises separating the buffer layer from the metal layer.

10. The method of claim 7, wherein the pellicle frame exposes at least a portion of the bottom surface of the membrane,
the temporary substrate is separated from the metal layer at a separation rate of about 0.1 mm/s to about 2 mm/s, and
the etching is performed for about 5 minutes to about 15 minutes.

11. A method of fabricating a pellicle structure, the method comprising:
forming a metal catalytic layer on a temporary substrate;
forming a membrane on the metal catalytic layer;
forming a first support layer on a top surface of the membrane;
forming a second support layer on the first support layer, wherein an internal space is formed by the first support layer, the second support layer, and the membrane; and
exposing a bottom surface of the metal catalytic layer by separating the temporary substrate from the metal catalytic layer,
wherein the first support layer comprises:
a body part on an edge region of the membrane; and
a handling part connected to the body part,
wherein, in a plan view, the handling part is spaced apart from the membrane.

12. The method of claim 11, wherein separating the temporary substrate from the metal catalytic layer comprises applying a force to the handling part of the first support layer to separate the temporary substrate from the metal catalytic layer.

13. The method of claim 11, further comprising exposing a bottom surface of the membrane by etching the bottom surface of the metal catalytic layer.

14. The method of claim 11, wherein
a top surface of the metal catalytic layer has a (100) plane, and
a thickness of the metal catalytic layer is in a range of about 400 nm to about 5 µm.

15. The method of claim 11, wherein the second support layer is in direct contact with the first support layer.

16. A method of fabricating a pellicle structure, the method comprising:
forming a metal layer on a temporary substrate;
forming a membrane on the metal layer, wherein the membrane comprises an edge region and a central region;
forming a first support layer on the edge region of the membrane;
forming a second support layer on the first support layer, wherein the second support layer is spaced apart from a top surface of the membrane at the central region of the membrane;
exposing a bottom surface of the metal layer by separating the temporary substrate from the metal layer;
separating the second support layer from the first support layer;
forming a sublimation support layer on the top surface of the membrane at the central region of the membrane;
exposing a bottom surface of the membrane by etching the bottom surface of the metal layer;
attaching a pellicle frame to the bottom surface of the membrane, the pellicle frame overlapping the central region of the membrane; and
removing the edge region of the membrane.

17. The method of claim 16, wherein separating the temporary substrate from the metal layer is performed in a solution.

18. The method of claim 16, wherein an internal space is formed by the membrane, the first support layer, and the second support layer, and
wherein the top surface of the membrane at the central region of the membrane faces the internal space.

19. The method of claim 16, wherein forming the sublimation support layer on the top surface of the membrane precedes exposing the bottom surface of the membrane and attaching the pellicle frame to the bottom surface of the membrane.

20. The method of claim 16, further comprising forming a third support layer on the bottom surface of the membrane,
wherein the third support layer overlaps the edge region of the membrane and is spaced apart from the pellicle frame.

* * * * *